United States Patent
Kudou et al.

(10) Patent No.: US 8,754,422 B2
(45) Date of Patent: Jun. 17, 2014

(54) SEMICONDUCTOR DEVICE AND PROCESS FOR PRODUCTION THEREOF

(75) Inventors: Chiaki Kudou, Hyogo (JP); Kenya Yamashita, Hyogo (JP); Masahiko Niwayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 13/503,172

(22) PCT Filed: Oct. 19, 2010

(86) PCT No.: PCT/JP2010/006199
§ 371 (c)(1),
(2), (4) Date: Apr. 20, 2012

(87) PCT Pub. No.: WO2011/048800
PCT Pub. Date: Apr. 28, 2011

(65) Prior Publication Data
US 2012/0205670 A1    Aug. 16, 2012

(30) Foreign Application Priority Data

Oct. 23, 2009 (JP) .................................. 2009-244614
Sep. 15, 2010 (JP) .................................. 2010-207102

(51) Int. Cl.
H01L 29/78    (2006.01)
(52) U.S. Cl.
USPC .............................. 257/77; 257/76; 438/478
(58) Field of Classification Search
USPC ........................................................ 257/77
See application file for complete search history.

(56) References Cited

U.S. PATENT DOCUMENTS 4,785,344 A * 11/1988 Franz .............................. 257/657
5,569,613 A * 10/1996 Yang .............................. 438/350
(Continued)

FOREIGN PATENT DOCUMENTS

JP    60-180163 A    9/1985
JP    01-094672 A    4/1989
(Continued)

OTHER PUBLICATIONS

Machine translation of JP 2006-128191 A (Satoshi; Nissan Motor Co., Ltd.).*

(Continued)

Primary Examiner — Kevin Parendo
Assistant Examiner — Charles N Ausar-El
(74) Attorney, Agent, or Firm — Renner, Otto, Boisselle & Sklar, LLP

(57) ABSTRACT

A semiconductor device 100 includes: a first silicon carbide layer 120 arranged on the principal surface of a semiconductor substrate 101; a first impurity region 103 of a first conductivity type arranged in the first silicon carbide layer; a body region 104 of a second conductivity type; a contact region 131 of the second conductivity type which is arranged at a position in the body region that is deeper than the first impurity region 103 and which contains an impurity of the second conductivity type at a higher concentration than the body region; a drift region 102 of the first conductivity type; and a first ohmic electrode 122 in ohmic contact with the first impurity region 103 and the contact region 131, wherein: a contact trench 121, which penetrates through the first impurity region 103, is provided in the first silicon carbide layer 120; and the first ohmic electrode 122 is arranged in the contact trench 121 and is in contact with the contact region 131 on at least a portion of a side wall lower portion 121cL and a bottom surface 121b of the contact trench.

16 Claims, 23 Drawing Sheets

(56) References Cited

U.S. PATENT DOCUMENTS

| | | | |
|---|---|---|---|
| 5,915,180 A * | 6/1999 | Hara et al. | 438/270 |
| 5,976,936 A | 11/1999 | Miyajima et al. | |
| 6,057,558 A * | 5/2000 | Yamamoto et al. | 257/77 |
| 6,445,035 B1 * | 9/2002 | Zeng et al. | 257/329 |
| 8,222,648 B2 * | 7/2012 | Tanimoto et al. | 257/77 |
| 2002/0038891 A1 * | 4/2002 | Ryu et al. | 257/350 |
| 2003/0011027 A1 | 1/2003 | Zeng et al. | |
| 2003/0020136 A1 | 1/2003 | Kitabatake et al. | |
| 2004/0217375 A1 | 11/2004 | Yokogawa et al. | |
| 2005/0001217 A1 | 1/2005 | Kusumoto et al. | |
| 2008/0150018 A1 | 6/2008 | Tanabe | |
| 2008/0203398 A1 | 8/2008 | Harris et al. | |
| 2008/0283909 A1 | 11/2008 | Akiyama et al. | |
| 2009/0212359 A1 | 8/2009 | Hsieh | |
| 2009/0242976 A1 | 10/2009 | Hino | |
| 2009/0269896 A1 * | 10/2009 | Chen et al. | 438/271 |
| 2010/0127323 A1 | 5/2010 | Chung et al. | |
| 2010/0171173 A1 | 7/2010 | Hsieh | |
| 2011/0049526 A1 * | 3/2011 | Chu et al. | 257/76 |

FOREIGN PATENT DOCUMENTS

| | | | |
|---|---|---|---|
| JP | 08-321605 A | | 12/1996 |
| JP | 10-308510 A | | 11/1998 |
| JP | 2002-124674 A | | 4/2002 |
| JP | 3527496 B | | 2/2004 |
| JP | 3773489 B | | 2/2006 |
| JP | 3784393 B | | 3/2006 |
| JP | 2006-128191 A | | 5/2006 |
| JP | 2006128191 A | * | 5/2006 |
| JP | 2006-148048 A | | 6/2006 |
| JP | 2008-160039 A | | 7/2008 |
| JP | 2008-288462 A | | 11/2008 |
| JP | 2009-246225 A | | 10/2009 |

OTHER PUBLICATIONS

International Search Report for corresponding International Application No. PCT/JP2010/006199 mailed Jan. 25, 2011.

International Report on Patentability for corresponding International Application No. PCT/JP2010/006199 mailed Jan. 17, 2012.

* cited by examiner

FIG.14
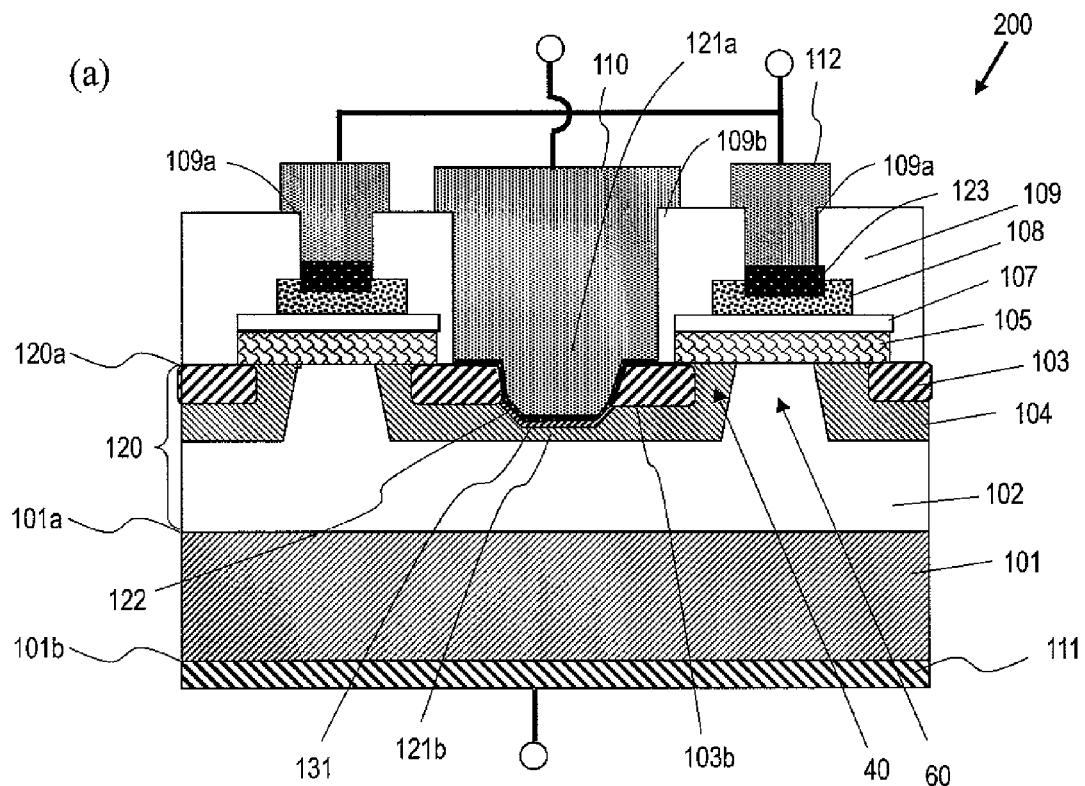
(a)
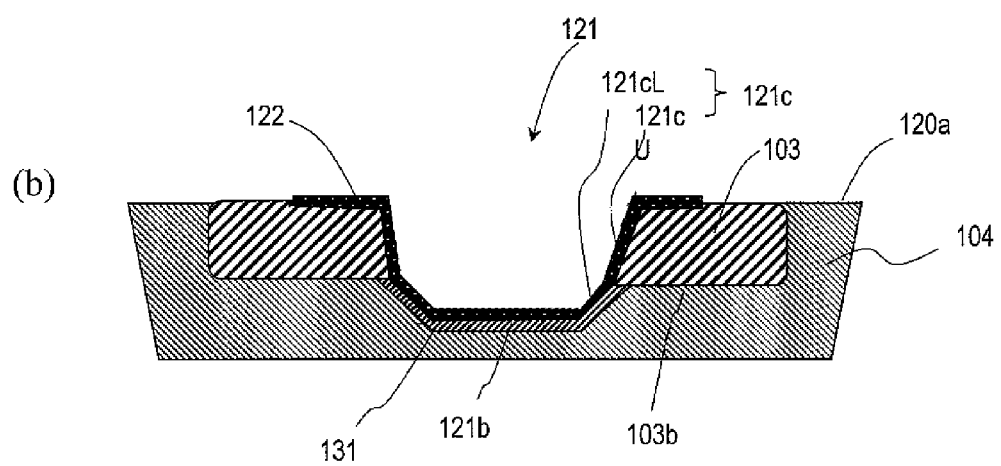
(b)

FIG. 17
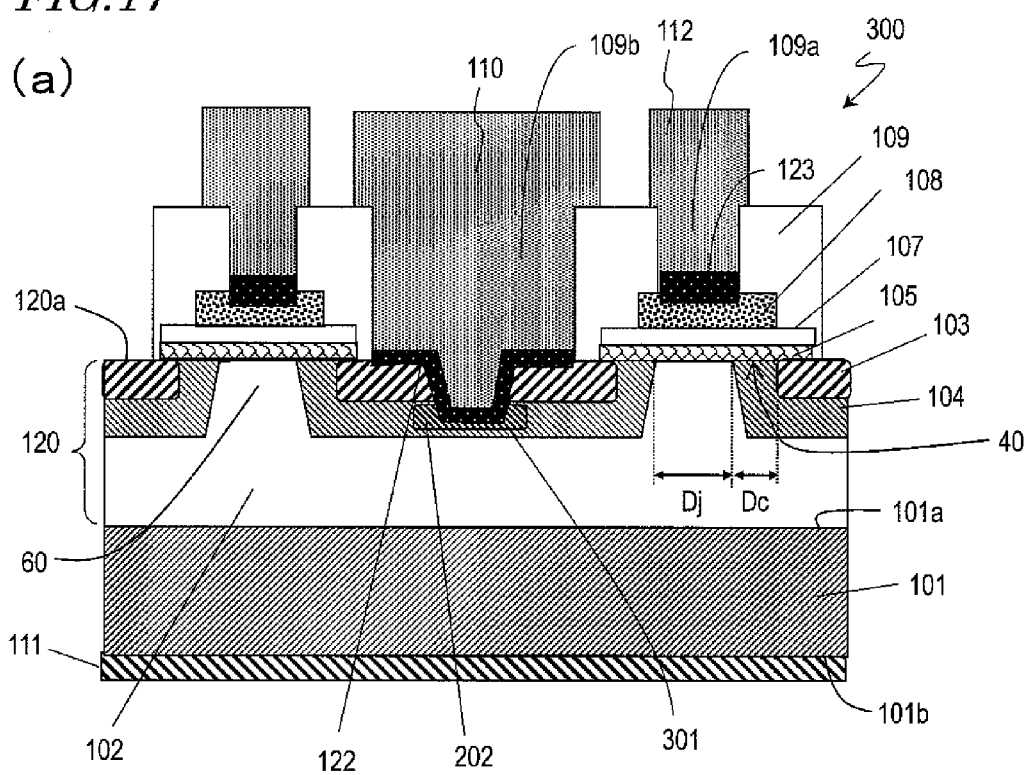
(a)
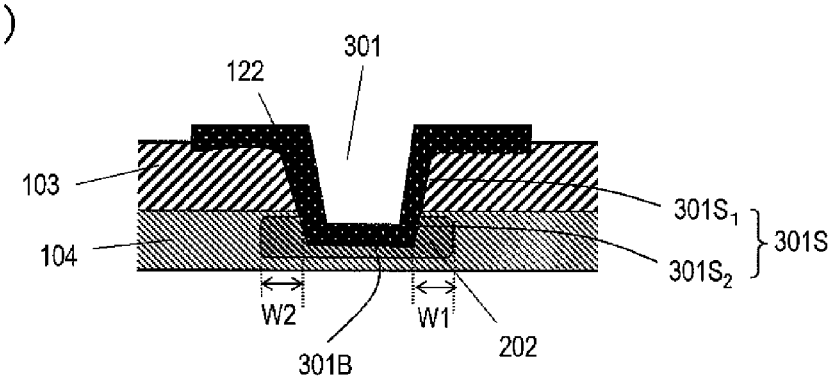
(b)
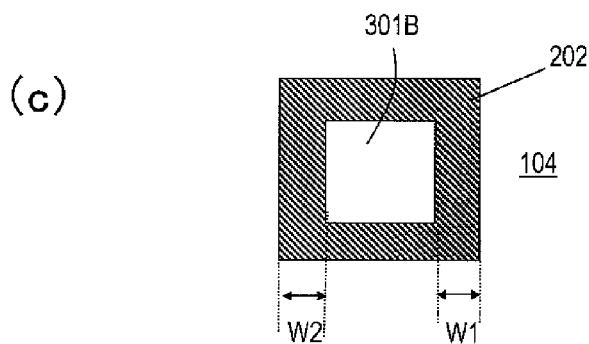
(c)

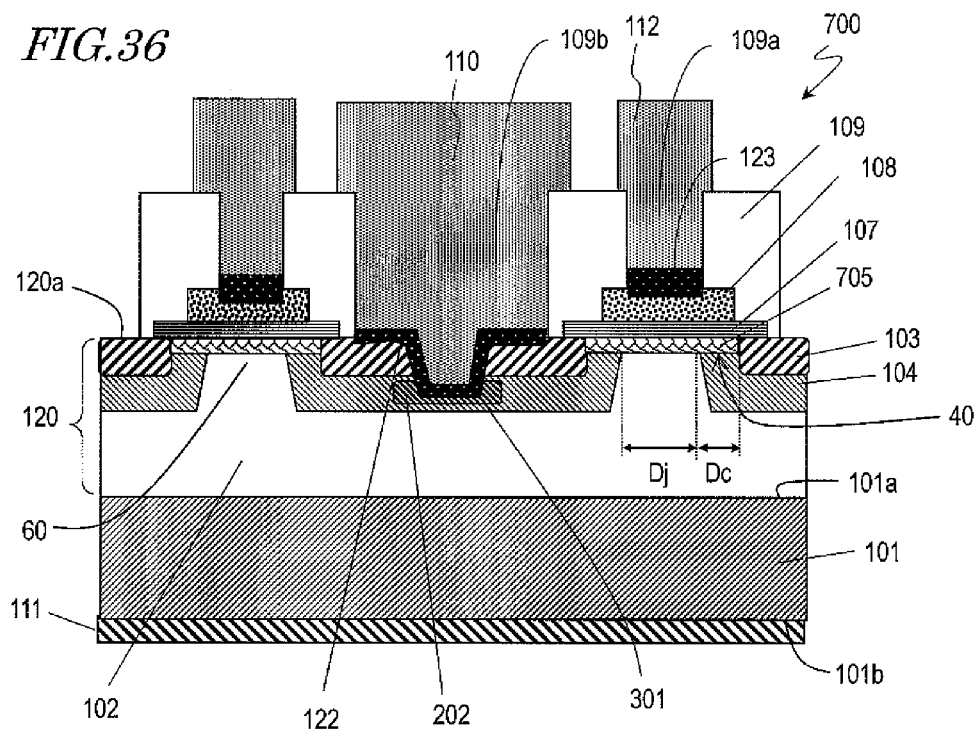
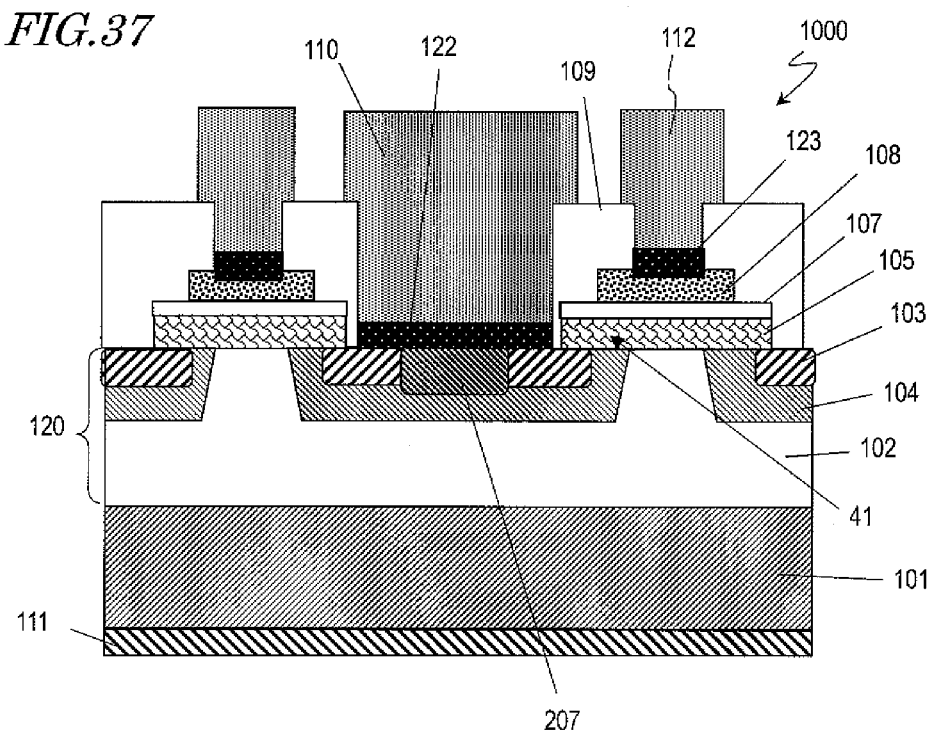

SEMICONDUCTOR DEVICE AND PROCESS FOR PRODUCTION THEREOF

TECHNICAL FIELD

The present invention relate to a semiconductor device and a method for manufacturing the same, and more particularly to a silicon carbide power semiconductor device.

BACKGROUND ART

A power semiconductor device is a semiconductor device which has a high withstand voltage and is used in applications in which a large current is conducted therethrough, and it is required to have a low loss. Recently, a power semiconductor device is used in a high-speed inverter. There is also a demand for high-speed operations in such applications.

Power semiconductor devices were conventionally produced using silicon (Si) substrates. In recent years, however, power semiconductor devices using silicon carbide (SiC) have drawn attention and have been developed (see, for example, Patent Document Nos. 1-4).

The breakdown voltage of the silicon carbide material itself is greater than that of silicon by one order of magnitude. Therefore, when a power semiconductor device is produced using silicon carbide, the reverse breakdown voltage can be maintained even if the depletion layer at the pn junction or the Schottky barrier junction is made thinner. Therefore, by decreasing the thickness of the device and increasing the doping concentration of the silicon carbide layer, it is possible to realize a power semiconductor device having a low ON resistance, a high withstand voltage and a low loss. Also, the saturation electron velocity of silicon carbide is about twice that of silicon, and it is possible to realize a high-speed operation.

Patent Document No. 1 discloses a silicon carbide semiconductor device with increased channel mobility and decreased ON resistance. FIG. 37 is a cross-sectional view illustrating the silicon carbide semiconductor device disclosed in Patent Document No. 1.

A silicon carbide semiconductor device 1000 shown in FIG. 37 is a vertical-type metal insulator semiconductor field effect transistor (hereinafter a "MISFET"), and has a planar structure. The semiconductor device 1000 includes a semiconductor substrate 101 containing n$^+$-type SiC. A first silicon carbide layer 120 of silicon carbide is provided on the principal surface of the semiconductor substrate 101. A p-type body region 104 having a predetermined depth is formed in a predetermined region of a surface portion of the first silicon carbide layer 120. A portion of the first silicon carbide layer 120 other than the body region 104 serves as an n$^-$-type drift region 102. An n$^+$-type first impurity region (source region) 103 is formed in the vicinity of the surface of the body region 104. A contact region 207 is provided in the body region 104. A second silicon carbide layer 105 connecting the first impurity region 103 and the drift region 102 with each other is arranged so as to cover the surface portion of the body region 104. A gate electrode 108 is formed on the surface of the second silicon carbide layer 105 with a gate oxide film 107 interposed therebetween.

An interlayer insulating film 109 is provided on the surface of the first silicon carbide layer 120 so as to cover the gate electrode 108. A contact hole is provided in the interlayer insulating film 109, through which the first impurity region 103 and the contact region 207 are exposed, and a first ohmic electrode (source electrode) 122 is provided in the contact hole, with an interconnect 110 further provided therein. A contact hole, through which the gate electrode 108 is exposed, is provided in the interlayer insulating film 109, and an interconnect 112 is provided in the contact hole. A metal silicide layer 123 is formed between the interconnect 112 and the gate electrode 108. A second ohmic electrode (drain electrode) 111 is formed on the reverse surface of the semiconductor substrate 101.

In the semiconductor device 1000 shown in FIG. 37, by applying a voltage between the first ohmic electrode 122 and the gate electrode 108 to give an electric field to the gate oxide film 107, an accumulation channel 41 is induced in the second silicon carbide layer 105, whereby carriers flow between the first ohmic electrode 122 and the second ohmic electrode 111.

By operating the semiconductor device 1000 in an accumulation mode for inducing a channel, it is possible to increase the channel mobility and reduce the ON resistance as compared with a case in which it is operated in an inversion mode where a channel is induced by inverting the conductivity type.

Next, referring to FIGS. 38 to 46, a method for manufacturing the silicon carbide semiconductor device 1000 will be described. First, as shown in FIG. 38, the semiconductor substrate 101 containing n$^+$-type SiC is prepared, and the first silicon carbide layer 120 of n$^-$-type SiC is formed on the principal surface thereof by an epitaxial growth method. Then, a first implantation mask 72 having openings formed therein in regions to be the body region 104 is formed.

The ion implantation for forming the body region 104 is performed while heating the semiconductor substrate 101 at a temperature of 400° C. to 600° C. An organic resist typically has poor heat resistance and is not suitable for the first implantation mask 72. Therefore, an inorganic film such as a silicon oxide film, a polysilicon or a silicon nitride film is formed on the principal surface of the first silicon carbide layer 120, with an organic resist mask formed thereon, and the inorganic film is etched using the organic resist mask to remove the organic resist. Thus, the heat-resistant first implantation mask 72 is obtained. FIG. 38 shows a cross section after the organic resist is removed and the body region 104 is formed. Hereinafter, masks for ion implantation are formed by a similar method. A portion of the first silicon carbide layer 120 other than the body region 104 serves as the drift region 102.

As shown in FIG. 39, after an inorganic film is deposited on the surface of the first silicon carbide layer 120 so as to cover the first implantation mask 72, an organic resist mask, which has a pattern that defines regions to be contact regions, is formed on the inorganic film (not shown). The inorganic film is anisotropically etched by a dry etching method using the organic resist mask, thereby forming a first sidewall 71 located on the side wall of the first implantation mask 72, and a second implantation mask 78 covering the contact region. An impurity is ion-implanted into the body region 104 using the first sidewall 71 and the second implantation mask 78, thereby forming the first impurity region 103.

Next, as shown in FIG. 40, after the first implantation mask 72, the first sidewall 71 and the second implantation mask 78 are removed, a third implantation mask 73 having openings formed therein in regions to be contact regions is formed on the surface of the first silicon carbide layer 120, and an aluminum ion, for example, is implanted into the first silicon carbide layer 120, thereby forming the contact region 207.

As shown in FIG. 41, after the third implantation mask 73 is removed, annealing is performed at a temperature of 1000° C. or more, e.g., 1700° C., thereby activating the impurities which have been implanted (not shown). Then, the second silicon carbide layer 105 is deposited on the principal surface of the first silicon carbide layer 120. As shown in FIG. 42, a photoresist 76, which defines the second silicon carbide layer 105, is formed, and unnecessary portions of the second silicon carbide layer 105 are removed by dry etching.

As shown in FIG. 43, the gate oxide film 107 is formed on the second silicon carbide layer 105, and the gate electrode 108 is formed thereon. Moreover, as shown in FIG. 44, the interlayer insulating film 109 is formed across the entire surface of the first silicon carbide layer 120 so as to cover the gate electrode 108. As shown in FIG. 45, a contact hole 109a, through which the gate electrode 108 is exposed, and a contact hole 109b, through which the contact region 207 and the first impurity region 103 are exposed, are formed in the interlayer insulating film 109.

As shown in FIG. 46, the first ohmic electrode 122 and the interconnect 110 are formed in the contact hole 109b, and the metal silicide layer 123 and the interconnect 112 are formed in the contact hole 109a. The second ohmic electrode 111 is formed on the reverse surface of the semiconductor substrate 101. Thus, the semiconductor device 1000 is completed.

CITATION LIST

Patent Literature

Patent Document No. 1: Japanese Laid-Open Patent Publication No. 10-308510
Patent Document No. 2: Japanese Patent No. 3773489
Patent Document No. 3: Japanese Patent No. 3784393
Patent Document No. 4: Japanese Patent No. 3527496

SUMMARY OF INVENTION

Technical Problem

In the semiconductor device 1000, the contact region 207 is in contact with the body region 104 on the bottom surface and a portion of the side surface thereof, while being in contact with the first ohmic electrode 122 only on the upper surface thereof. Therefore, in order to bring the body region 104 to the same potential as the first ohmic electrode 122, it is necessary that sufficient conductivity be ensured between the upper surface of the contact region 207 contacting the first ohmic electrode 122 and the bottom surface and the side surface thereof contacting the body region 104. Therefore, conventionally, a p-type impurity ion is implanted in several iterations while varying the implantation energy to form the contact region 207. However, impurities typically less easily diffuse through silicon carbide, and therefore ion implantation requires a longer time, thus increasing the load on ion implanters.

Normally, it is difficult to form a good ohmic contact to p-type silicon carbide, as compared with n-type silicon carbide. This is because the barrier between major ohmic metals and p-type silicon carbide is greater than that with n-type silicon carbide. In order to form a good ohmic contact to p-type silicon carbide, an ohmic metal needs to diffuse into p-type silicon carbide with a higher concentration. However, there is a limit on the solid dissolution of impurity into silicon carbide. Increasing the annealing temperature in order to increase the diffusion of the ohmic metal will lead to other problems such as warping of the wafer, and evaporation and disappearance of SiC.

Problems of the semiconductor device 1000 when the contact resistance between the first ohmic electrode 122 and the body region 104 cannot be reduced for reasons described above, etc., will now be described.

As shown in FIG. 47, in the OFF state of the semiconductor device 1000 where a voltage (e.g., 0 V) less than or equal to the threshold value (Vth) is applied between the first ohmic electrode 122 and the gate electrode 108, a depletion layer is formed between the body region 104 and the drift region 102. Therefore, in a JFET (Junction Field-Effect Transistor) region 60, which is a portion of the drift region 102 sandwiched between adjacent body regions 104, depletion layers extending from both sides of the body regions 104 are connected together. In order to transition at a high speed from this OFF state to the ON state, it is necessary that the depletion layer of the JFET region 60 shrink and a current path be formed in the JFET region 60, instantaneously once a voltage, of which the positive side is the side of the gate electrode 108, is applied between the first ohmic electrode 122 and the gate electrode 108.

However, if the contact resistance for the body region 104 is large, the potential slowly transfers to the end of the body region 104 and the depletion layer shrinks slowly, and it therefore takes a long time before the semiconductor device 1000 is completely turned ON. That is, as shown in FIG. 47, the structure becomes equivalent to one with parasitic transistors T1 whose gate is the body region 104 sandwiched between the first impurity region 103 and the JFET region 60, and the amount of time required for the switching of the transistor T1 causes a delay in the switching of the semiconductor device 1000.

On the other hand, as shown in FIG. 48, in the ON state of the semiconductor device 1000 where a voltage (e.g., 20 V) higher than the threshold value (Vth), of which the positive side is the side of the gate electrode 108, is applied between the first ohmic electrode 122 and the gate electrode 108, the accumulation channel 41 is formed in the second silicon carbide layer 105 via the gate oxide film 107, and electrons flow into the accumulation channel 41. Then, since electrons accumulated in the depletion layer formed between the body region 104 and the drift region 102 are also utilized, the potential of the body region 104 (hereinafter referred to as the body potential) comes closer to the source potential, and the depletion layer shrinks, thereby forming a current path in the JFET region 60 and reaching the ON state.

The external resistance is selected so that the drain voltage becomes about 1 V to 2 V due to a voltage drop of the external resistance. If the transistor is turned OFF, the source potential and the body potential are both 0 V, and the drain voltage is substantially 0 to 2 V.

However, if the contact resistance for the body region 104 is large, the potential slowly transfers to the end of the body region 104 and the body potential increases by about 2.7 V, thereby turning ON parasitic bipolar transistors T2 formed between the source, the body and the drain, and conducting a current flow from the drain to the source. Therefore, it takes a long time before it is completely turned OFF.

The present invention has been made in view of such problems as described above, and an object thereof is to provide semiconductor device capable of a high-speed operation by decreasing the contact resistance value for the body region.

Solution to Problem

A semiconductor device of the present invention includes: a semiconductor substrate having a principal surface and a reverse surface; a first silicon carbide layer arranged on the principal surface of the semiconductor substrate; a first impurity region of a first conductivity type arranged in the first silicon carbide layer; a body region of a second conductivity type arranged adjacent to the first impurity region in the first silicon carbide layer; a contact region of the second conductivity type which is arranged at a position deeper than the first impurity region in the body region and which contains an impurity of the second conductivity type at a higher concentration than the body region; a drift region of the first conductivity type arranged in a region of the first silicon carbide layer other than the body region and the first impurity region; and a first ohmic electrode in ohmic contact with the first impurity region and the contact region, wherein: a contact trench, which penetrates through the first impurity region, is provided in the first silicon carbide layer, the contact trench having a bottom surface and a side wall, and the side wall of the contact trench including a side wall lower portion present at a position deeper than a bottom surface of the first impurity region and a side wall upper portion present at a position at the same level or shallower than the bottom surface of the first impurity region; and the first ohmic electrode is arranged in the contact trench and in contact with the contact region on at least a portion of the side wall lower portion and the bottom surface of the contact trench.

A method for manufacturing a semiconductor device of the present invention includes: a step (a) of using a semiconductor substrate having a principal surface and a reverse surface to form a first silicon carbide layer on the principal surface of the semiconductor substrate, the first silicon carbide layer including a body region of a second conductivity type, a first impurity region of a first conductivity type arranged adjacent to the body region, and a drift region of the first conductivity type arranged in a region other than the body region and the first impurity region, at least a portion of the body region being present at a position deeper than the first impurity region; a step (b) of forming a contact trench, which penetrates through the first impurity region to reach the body region, in the first silicon carbide layer; a step (c) of implanting an impurity of the second conductivity type into the body region from a bottom surface and a side wall of the contact trench, thereby forming a contact region of the second conductivity type at a position deeper than the first impurity region; and a step (d) of forming a first ohmic electrode at least in the contact trench so as to be in contact with the first impurity region and in contact with the contact region on a portion of the side wall and the bottom surface of the contact trench.

Another method for manufacturing a semiconductor device of the present invention includes: a step (A) of using a semiconductor substrate having a principal surface and a reverse surface to form a first silicon carbide layer on the principal surface of the semiconductor substrate, the first silicon carbide layer including a body region of a second conductivity type, a first impurity region of a first conductivity type arranged adjacent to the body region, and a drift region of the first conductivity type arranged in a region other than the body region and the first impurity region, at least a portion of the body region being present at a position deeper than the first impurity region; a step (B) of forming a contact region of the second conductivity type at a position in the body region deeper than the first impurity region, the contact region containing an impurity of the second conductivity type at a higher concentration than the body region; a step (C) of forming a contact trench, which penetrates through the first impurity region to reach the contact region, in the first silicon carbide layer; and a step (D) of forming a first ohmic electrode in the contact trench so as to be in contact with the first impurity region and in contact with the contact region on a portion of a side wall and a bottom surface of the contact trench.

According to the present invention, it is possible to increase the contact area between the contact region and the first ohmic electrode while ensuring the contact area between the first impurity region and the first ohmic electrode. Therefore, since the contact resistance of the first ohmic electrode for the body region can be reduced, the potential of the body region can be matched with the potential of the first ohmic electrode at a very high speed, thereby increasing the switching speed of the semiconductor device. It is also possible to suppress the contact resistance of the first ohmic electrode for the first impurity region to be low, thereby realizing a low ON resistance.

Advantageous Effects of Invention

According to the present invention, since the contact resistance between the first ohmic electrode and the body region can be reduced, it is possible to realize a semiconductor device capable of high-speed operations by suppressing delay in switching operations.

With the method for manufacturing a semiconductor device of the present invention, it is possible to reduce the number of times the contact region is implanted, thereby shortening the amount of time required for the ion implantation step.

BRIEF DESCRIPTION OF DRAWINGS

FIG. 14 (a) is a schematic cross-sectional view of a semiconductor device according to a second embodiment of the present invention, and (b) is an enlarged cross-sectional view of a contact trench portion shown in (a).

FIG. 17 (a) is a cross-sectional schematic view showing a semiconductor device according to a third embodiment of the present invention, and (b) is an enlarged cross-sectional view of a contact trench portion shown in (a). FIG. 17(c) is a plan view illustrating an arrangement relationship between the bottom surface of the contact trench and the contact region.

FIG. 36 is a schematic cross-sectional view of still another semiconductor device according to the third embodiment of the present invention.

FIG. 37 is a cross-sectional schematic view showing a conventional semiconductor device.

FIG. 47 is a schematic cross-sectional view illustrating an equivalent circuit produced when the conventional semiconductor device is turned ON.

DESCRIPTION OF EMBODIMENTS

First Embodiment

Figure 1:
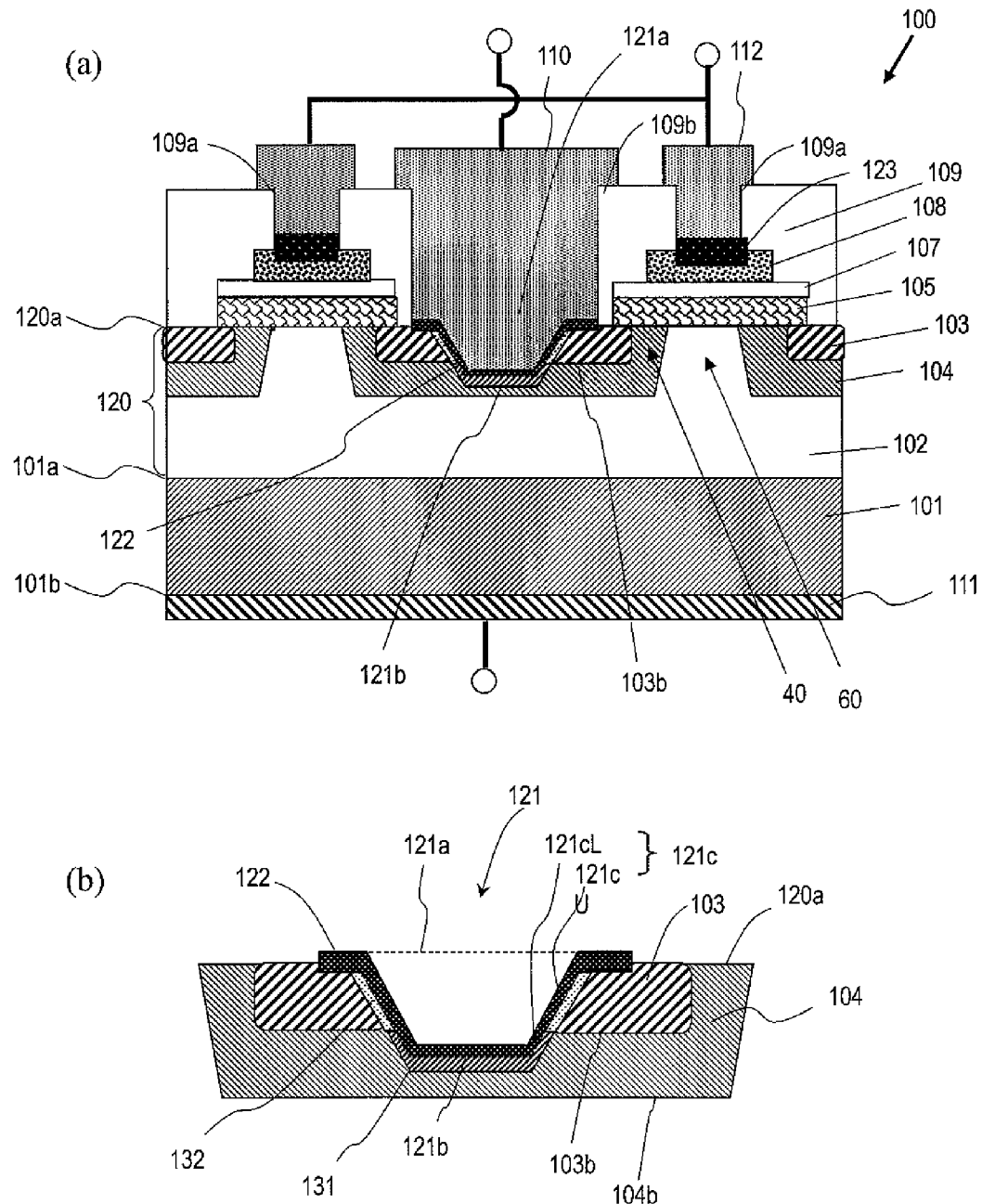
FIG. 1(a) is a schematic cross-sectional view showing a semiconductor device according to a first embodiment of the present invention, and (b) is an enlarged cross-sectional view of a contact trench portion shown in (a).

A first embodiment of the present invention will now be described with reference to the drawings. In subsequent figures, elements having substantially the same function as those of the conventional semiconductor device are denoted by the same reference numerals. The present invention is not limited to the following embodiments. The first conductivity type may be either the n type or the p type, in which case the second conductivity type is the p type or the n type.

FIG. 1(a) schematically shows the cross-sectional structure of a semiconductor device 100, which is the first embodiment of the present invention. The semiconductor device 100 has a principal surface 101a and a reverse surface 101b, and includes a semiconductor substrate 101 of the first conductivity type containing silicon carbide. A first silicon carbide layer of the first conductivity type is provided on the principal surface 101a of the semiconductor substrate 101. The first silicon carbide layer is an epitaxial layer. A body region 104 of the second conductivity type and a first impurity region 103 of the first conductivity type arranged so as to be adjacent to the body region 104 are formed in the first silicon carbide layer 120. The impurity concentration of the first impurity region 103 of the first conductivity type is higher than the impurity concentration of the semiconductor substrate 101. At least a portion of the body region 104 is located deeper than the first impurity region 103. A contact region 131 of the second conductivity type containing an impurity of the second conductivity type at a higher concentration than the body region 104 is arranged in the body region 104 located deeper than the first impurity region 103. A region of the first silicon carbide layer 120 other than the body region 104 and the first impurity region 103 serves as a drift region 102. The impurity concentration of the drift region 102 is lower than the impurity concentration of the semiconductor substrate 101.

More specifically, the body region 104 is formed in a region of the first silicon carbide layer 120 from an upper surface 120a to a predetermined depth, and the first impurity region 103 is formed in a region of the body region 104 from the upper surface 120a to a predetermined depth. The bottom surface of the first impurity region 103 is shallower than the position of the bottom surface of the body region 104, and the first impurity region 103 is not protruding out of the body region 104. The body region 104 and the first impurity region 103 are exposed on the upper surface 120a of the first silicon carbide layer 120. The first impurity region 103 is surrounded by the body region 104 on the upper surface 120a of the first silicon carbide layer 120.

A contact trench 121, which penetrates through the first impurity region 103, is provided in the first silicon carbide layer 120. A first ohmic electrode 122, which is in ohmic contact with the first impurity region 103 and the contact region 131, is provided in the contact trench 121. The first ohmic electrode 122 is in contact with the contact region 131 on a portion of the side wall and the bottom surface of the contact trench 121.

FIG. 1(b) is an enlarged cross-sectional view of the body region 104 and the first impurity region 103. As shown in the figure, the contact trench 121 has a bottom surface 121b and a side wall 121c. The side wall 121c includes a side wall lower portion 121cL that is located deeper than a bottom surface 103b of the first impurity region 103, and a side wall upper portion 121cU that is located at the same level or shallower than the bottom surface 103b of the first impurity region 103. The bottom surface 121b of the contact trench 121 is located deeper than the bottom surface 103b of the first impurity region 103 and shallower than a bottom surface 104b of the body region 104.

The contact region 131 is formed between the first ohmic electrode 122 and the body region 104 along the side wall lower portion 121cL and the bottom surface 121b of the contact trench 121. Therefore, it is in contact with the first ohmic electrode 122 on at least a portion of the side wall lower portion 121cL and the bottom surface 121b of the contact trench 121.

In the illustrated example, a second impurity region 132 is formed between the first impurity region 103 and the first ohmic electrode 122 along the side wall upper portion 121cU of the contact trench 121. The second impurity region 132 is a region formed by implanting an impurity of the second conductivity type into the first impurity region 103. Therefore, the second impurity region 132 includes both an impurity of the first conductivity type, the same conductivity type as that of the impurity contained in the first impurity region 103, and an impurity of the second conductivity type, the same conductivity type as that of the impurity contained in the contact region 131. It contains the impurity of the first conductivity type at substantially the same concentration as the first impurity region 103, and contains the impurity of the second conductivity type at a concentration higher than the first impurity region 103.

The conductivity type of the second impurity region 132 is not limited to a particular type. Depending on the conductivity type of the impurity that is contained therein in a greater quantity, the second impurity region 132 may become a first conductivity type region or a second conductivity type region. Where the second impurity region 132 is a first conductivity type region, the second impurity region 132 functions as a source region integrally with the first impurity region 103. Thus, since the first ohmic electrode 122 is connected to the source region across the entire side wall upper portion 121cU of the contact trench 121, it is possible to reduce the ON resistance.

In the present embodiment, the first ohmic electrode 122 is arranged not only in the contact trench 121 but also on a portion of the upper surface 120a of the first silicon carbide layer 120. The first ohmic electrode 122 is in contact with the first impurity region 103 on the upper surface 120a of the first silicon carbide layer 120 (a portion of the upper surface 120a that is located along the periphery of the contact trench 121).

As will be described later, the second impurity region 132 does not need to be provided along the side wall upper portion 121cU of the contact trench 121. In such a case, the first ohmic electrode 122 is in contact with the first impurity region 103 not only on the upper surface of the first silicon carbide layer 120 but also on the side wall upper portion 121cU of the contact trench 121. Where the second impurity region 132 is not provided, the first ohmic electrode 122 does not need to be arranged on the upper surface 120a of the first silicon carbide layer 120. For example, where the first ohmic electrode 122 is arranged only in the contact trench 121, the first ohmic electrode is connected to the first impurity region 103 on the side wall upper portion 121cU of the contact trench 121.

In the present embodiment, the area of an opening 121a of the trench is greater than the area of the bottom surface 121b of the contact trench 121, and the contact trench 121 has a tapered shape. Therefore, the side wall 121c of the contact trench 121 is non-vertical to the upper surface 120a of the first silicon carbide layer 120. The side wall 121c is facing the opening 121a. Non-vertical, as used herein, refers to the side wall 121c of the contact trench 121 forming an angle that is less than 85 degrees or greater than 95 degrees with respect to the upper surface 120a of the first silicon carbide layer 120.

The shape of the contact trench 121 is not limited to the tapered shape as shown in FIG. 1(b). The trench may have any other shape as long as the bottom surface 121b of the contact trench 121 is located deeper than the bottom surface 103b of the first impurity region 103.

Since the contact trench 121 having such a structure is provided in the semiconductor device 100, the first ohmic electrode 122 is in contact with the contact region 131 not only on the bottom surface 121b of the contact trench 121 but also on a portion of the side wall 121c thereof at a position deeper than the bottom surface 103b of the first impurity region 103. Therefore, the contact area between the contact region 131 and the first ohmic electrode 122 is increased, and it is possible to reduce the contact resistance for the body region 104. Therefore, the potential of the body region 104 can be matched with the first ohmic electrode 122 at a very high speed.

Since the bottom surface 121b and a portion of the side wall 121c of the contact trench 121 are located deeper than the bottom surface 103b of the first impurity region 103, the body region 104 is exposed on the bottom surface 121b and the side wall 121c of the contact trench 121. Therefore, by implanting an impurity of the second conductivity type in the vicinity of the surface of the body region 104 exposed in the contact trench 121, it is possible form the contact region 131 in the body region 104. Therefore, unlike the conventional semiconductor device, it is not necessary to deeply implant an impurity of the second conductivity type in order to form a contact region for the body region 104, and it is possible to reduce the amount of time required for manufacturing the semiconductor device and thus to reduce the manufacturing cost.

It is preferred that at least the side wall lower portion 121cL of the side wall 121c of the contact trench 121 is non-vertical with respect to the upper surface 120a of the first silicon carbide layer 120, because it is then possible to increase the contact area between the contact region 131 and the first ohmic electrode 122. This is because the contact area between the contact region 131 and the first ohmic electrode 122 increases as the side surface lower portion 121cL is more inclined off the direction vertical to the upper surface 120a. In such a case, it is more preferred that the side wall lower portion 121cL is inclined so as to face the opening 121a of the contact trench 121. Particularly, it is preferred that at least the side wall lower portion 121cL of the side wall 121c of the contact trench 121 is inclined so as to face the opening 121a, i.e., has an angle less than 90 degrees with respect to a plane parallel to the principal surface 101a of the semiconductor substrate 101. More preferably, the angle is less than 85 degrees. This, in a process described later, makes it easier to implant an ion into the first silicon carbide layer 120 from the side wall lower portion 121cL of the contact trench 121 to form the contact region 131. For example, by implanting an impurity of the second conductivity type vertically to the first silicon carbide layer 120 using a mask for forming the contact trench 121, it is possible to implant an impurity of the second conductivity type in the vicinity of the surface of the body region 104 exposed on the bottom surface 121b and the side wall 121c of the contact trench 121 from the opening 121a of the contact trench 121.

Of the first silicon carbide layer 120, the drift region 102, which is sandwiched between adjacent body regions 104, is referred to as a JFET (Junction Field-Effect Transistor) region 60. The semiconductor device 100 controls the current in a path extending from the first impurity region 103 provided in the body region 104 via the JFET region 60 to the reverse surface 101b of the semiconductor substrate 101. Thus, the semiconductor device 100 at least includes a gate insulating film 107 provided above a partial region 40 of the body region 104, and a gate electrode 108 provided on the gate insulating film 107, wherein the partial region 40 is located between the first impurity region 103 and the drift region 102 of the first silicon carbide layer 120, which is exposed on the upper surface 120a, i.e., between the first impurity region 103 and the JFET region 60, and the current control described above is performed by the voltage applied to the gate electrode 108. Then, as described above, the potential of the partial region 40 of the body region 104 can be matched with the potential of the first ohmic electrode 122 at a very high speed. Therefore, it is possible to operate the semiconductor device 100 without causing a delay with respect to the switching by the voltage applied to the gate electrode 108.

For such reasons, the semiconductor device 100 may include either an accumulation channel or an inversion channel as long as it is possible to perform the current control by the voltage applied to the gate electrode 108. In the present embodiment, the semiconductor device 100 further includes the second silicon carbide layer 105, which is provided between the partial region 40 of the body region 104 and the gate insulating film 107, the partial region 40 being located between the first impurity region 103 and the JFET region 60, and the second silicon carbide layer 105 functions as an accumulation channel. The second silicon carbide layer 105 is an epitaxial layer, and is electrically connected to the first impurity region 103 and the partial region 40 of the body region 104. With a semiconductor device having an inversion channel, the gate insulating film 107 is in direct contact with the partial region 40 of the body region 104 located between the first impurity region 103 and the JFET region 60.

The interlayer insulating film 109 is provided so as to cover the upper surface 120a of the first silicon carbide layer 120, and the contact hole 109a exposing the gate electrode 108 and the contact hole 109b exposing the first ohmic electrode 122 are provided in the interlayer insulating film 109. The interconnect 112 is provided in the contact hole 109a, and the interconnect 112 is in contact with, and electrically connected to, the gate electrode 108. In the present embodiment, the metal silicide layer 123 is provided between the interconnect 112 and the gate electrode 108. The interconnect 110 is provided in the contact hole 109b, and the interconnect 110 is in contact with, and electrically connected to, the first ohmic electrode 122. A second ohmic electrode 111 is provided on the reverse surface 101b of the semiconductor substrate 101.

With the semiconductor device 100 of the present embodiment, the well contact resistance value of the first ohmic electrode 122 can be reduced by the provision of the contact trench 121. Therefore, the potential of the body region 104 can be matched with the potential of the first ohmic electrode 122 at a very high speed, and it is possible to suppress the delay in well potential variation and suppress the delay in the switching speed of the semiconductor device 100.

The semiconductor device 100 of the present embodiment is a power semiconductor device formed by an SiC semiconductor, and is suitably used in applications with a high withstand voltage, a large current, and a high operating speed. Next, an example of a specific configuration of the present embodiment will be shown below. In an example of the present embodiment, the first conductivity type is the n type and the second conductivity type is the p type. In such a case, the first ohmic electrode 122 is the source electrode, and the second ohmic electrode 111 is the drain electrode. The first impurity region 103 is the source region. In the example below, the more plus "+" symbols there are, the higher the impurity concentration, and the impurity concentration decreases in the order from "++" to "+" to "−" (++>+>−).

The semiconductor substrate 101 is made of a hexagonal silicon carbide. The thickness of the semiconductor substrate 101 is 250 μm to 350 μm, for example, and the impurity concentration of the semiconductor substrate 101 is $8 \times 10^{18}$ cm$^{-3}$ (n$^+$), for example. Where the impurity concentration is set to be low, a substrate made of a cubic silicon carbide may be used as the semiconductor substrate 101.

The first silicon carbide layer 120 is an SiC layer formed by epitaxial growth on the principal surface 101a of the semiconductor substrate 101. The thickness of the first silicon carbide layer 120 is 4 μm to 15 μm, for example, and the impurity concentration is $5 \times 10^{15}$ cm$^{-3}$ (n$^-$), for example. Another epitaxial layer (e.g., an SiC layer having a concentration of $6 \times 10^{16}$ cm$^{-3}$) may be provided between the semiconductor substrate 101 and the first silicon carbide layer 120.

The thickness of the body region 104 (i.e., the depth from the upper surface 120a) is 0.5 μm to 1.0 μm, for example, and the impurity concentration of the body region 104 is $1.5 \times 10^{18}$ cm$^{-3}$ (p$^-$), for example. The thickness of the first impurity region 103 (the depth from the upper surface 120a) is 0.25 µm, for example, and the impurity concentration of the first impurity region 103 is $5 \times 10^{19}$ cm$^{-3}$ (n$^{++}$), for example. The thickness of the contact region 131 (the thickness in the direction vertical to the principal surface 101a of the semiconductor substrate 101) is 50 nm, for example, and the impurity concentration of the contact region 131 is $1.0 \times 10^{19}$ cm$^{-3}$ (p$^+$), for example. The thickness of the second impurity region 132 is 50 nm, for example, and the impurity concentration of the second impurity region 132 is $1.0 \times 10^{19}$ cm$^{-3}$ (n$^+$), for example.

The depth of the contact trench 121 is about 0.4 µm. After the formation of the contact trench 121, a contact region having a thickness of 0.05 µm is provided on the bottom surface 121b and the side wall 121c of the contact trench 121. Thus, the concentration of the interface of the body region 104 with the first ohmic electrode 122 is $2 \times 10^{20}$ cm$^{-3}$ (p$^-$), for example. The length (width) of the JFET region 60 is 3 µm, for example.

The second silicon carbide layer 105 is an SiC layer formed by epitaxial growth on the first silicon carbide layer 120, and the thickness of the second silicon carbide layer 105 is 30 nm to 150 nm, for example. The length (width) of the partial region 40 of the body region 104 is 0.5 µm, for example.

The gate insulating film 107 is made of SiO$_2$ (silicon oxide). Thickness is 70 nm, for example. The gate electrode 108 is made of poly-Si (polysilicon), and the thickness thereof is 500 nm, for example. The first ohmic electrode 122 is made of an alloy between Ni (nickel) and Si (silicon), and the thickness thereof is 50 nm, for example. The first ohmic electrode 122 may be formed by an alloy between Ti (titanium) and Si (silicon). The second ohmic electrode 111 is also made of an alloy between Ti (titanium) and Si (silicon) or an alloy between Ni (nickel) and Si (silicon), and the thickness thereof is 100 nm, for example. Ni and Ag, or Ni and Au, may be deposited on the second ohmic electrode 111 so as to facilitate the soldering when the semiconductor device 100 is encapsulated in a plastic package.

(Method For Manufacturing Semiconductor Device of First Embodiment)

Next, referring to FIGS. 2 to 13, a method for manufacturing the semiconductor device 100 of the present embodiment will be described. FIGS. 2 to 13 are step-by-step cross-sectional schematic views illustrating the manufacturing method of the present embodiment.

First, an n-type 4H—SiC (0001) substrate is prepared as the semiconductor substrate 101. This substrate is offcut by 8° or 4° in the <11-20> direction, for example, and the n-type impurity concentration is $1 \times 10^{18}$ cm$^{-3}$ to $5 \times 10^{19}$ cm$^{-3}$.

Figure 2:
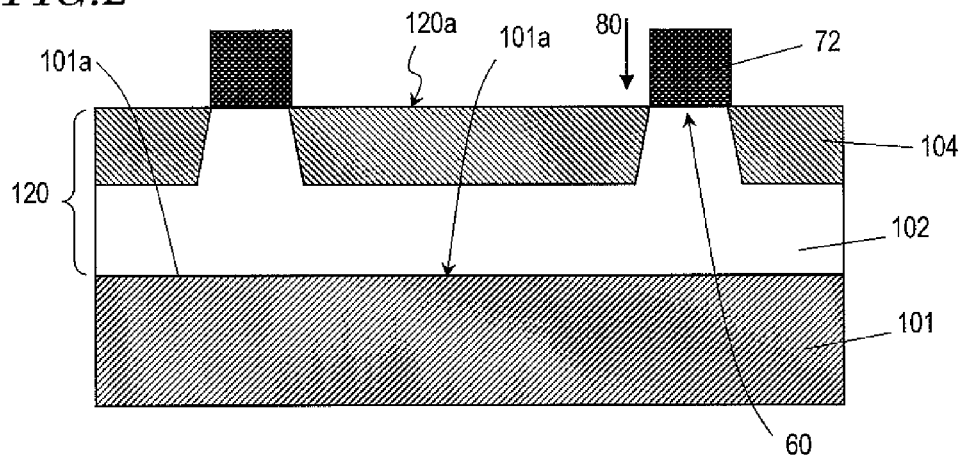
FIG. 2 is a step-by-step cross-sectional view illustrating a method for manufacturing a semiconductor device of the first embodiment.

Then, as shown in FIG. 2, the first silicon carbide layer 120 is formed by epitaxial growth on the principal surface 101a of the semiconductor substrate 101. For example, the first silicon carbide layer 120 is epitaxially grown by a thermal CVD method, using silane (SiH$_4$) and propane (C$_3$H$_8$) as material gases, hydrogen (H$_2$) as a carrier gas, and a nitrogen (N$_2$) gas as a dopant gas. The thickness of the first silicon carbide layer 120 is 10 µm or more, and the impurity concentration is $1 \times 10^{15}$ cm$^{-3}$ to $1 \times 10^{16}$ cm$^{-3}$.

Next, an implantation mask material is deposited (not shown) on the upper surface 120a of the first silicon carbide layer 120, and a photoresist (not shown) is formed on the implantation mask material. The implantation mask material is SiO$_2$ (silicon oxide), for example. The implantation mask material made of silicon oxide is deposited by a plasma CVD method with a power of 200 W using silane (SiH$_4$) and N$_2$O gases, for example. The thickness of the implantation mask material is 0.5-1.0 µm, for example. The photoresist (not shown) is positioned and sized so as to define the body region 104 and the JFET region 60. For example, the photoresist is a photosensitive organic film, and is formed by using a typical photolithography method. The thickness of the photoresist is 1.5-2.0 µm, for example. The implantation mask material is anisotropically etched using the photoresist as a mask to form an implantation mask pattern (first implantation mask) 72, and the photoresist is removed thereafter. The etching of the implantation mask material is performed by an anisotropic dry etching method using a CF$_4$ gas and a CHF$_3$ gas, for example. The photoresist is removed by ashing with an oxygen plasma, for example. Hereinafter, implantation masks for ion implantation are formed by similar methods unless otherwise specified.

Then, a p-type impurity ion (e.g., Al$^+$) 80 is implanted into the first silicon carbide layer 120 using the first implantation mask 72, thereby forming the body region 104 having a predetermined depth in the vicinity of the upper surface 120a of the first silicon carbide layer 120. For example, the ion implantation is performed in a plurality of iterations with different levels of energy in the range of 30 keV to 350 keV while keeping the substrate temperature at 500° C. The depth of the body region 104 is 0.5 µm to 1.0 µm, for example. The region in the vicinity of the upper surface 120a of the first silicon carbide layer 120, which is defined by being sandwiched between the body regions 104, serves as the JFET region 60. The width of the JFET region 60 of the present embodiment is 3 µm, for example. The remaining region of the first silicon carbide layer 120, in which the body regions 104 are not formed, serves as the drift region 102.

Figure 3:
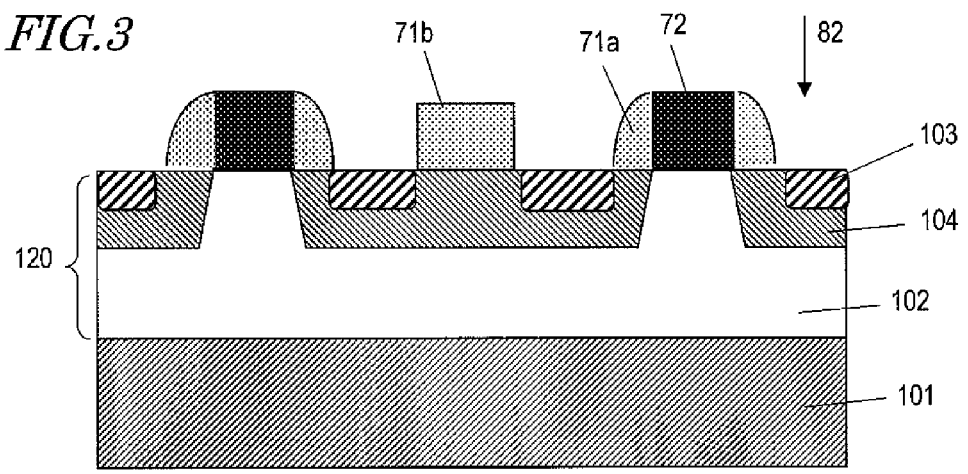
FIG. 3 is a step-by-step cross-sectional view illustrating the method for manufacturing a semiconductor device of the first embodiment.

Next, as shown in FIG. 3, an implantation mask material is deposited on the upper surface 120a of the first silicon carbide layer 120 so as to cover the first implantation mask 72. The implantation mask material is poly-Si (polysilicon), for example, and is formed by a thermal CVD method using SiH$_4$ as a material gas. After a photoresist having a predetermined pattern is formed on the implantation mask material, the implantation mask material is anisotropically etched, thereby forming implantation mask patterns 71a and 71b. The implantation mask pattern 71b shown in the figure is a pattern present below the photoresist, and is provided so that an impurity is not introduced into a region in which the contact trench 121 is to be formed. The implantation mask pattern 71a is a sidewall of an implantation mask pattern 72, and defines the channel width (length). The gas used in anisotropic etching is a mixed gas of Cl$_2$, O$_2$, HBr, etc., for example. The implantation mask pattern 71b may not be provided because trench etching is performed in a subsequent step.

Next, an n-type impurity ion 82 is implanted into the upper surface 120a of the first silicon carbide layer 120 using the first implantation mask 72 and the implantation mask patterns 71a and 71b as a mask, thereby forming the first impurity region 103. N$^+$ (nitrogen ion) or P$^+$ (phosphorus ion) is used as the impurity ion 82, for example. The first impurity region 103 is arranged so as to have its bottom surface at a position shallower than the bottom surface of the body region 104. Therefore, at least a portion of the body region 104 is arranged at a position deeper than the bottom surface of the first impurity region 103.

For example, the ion implantation for forming the first impurity region 103 is performed in a plurality of iterations with different levels of energy in the range of 30 keV to 90 keV while keeping the temperature of the substrate 101 at 500° C. The depth of the first impurity region 103 is 0.25 µm, for example.

Figure 4:
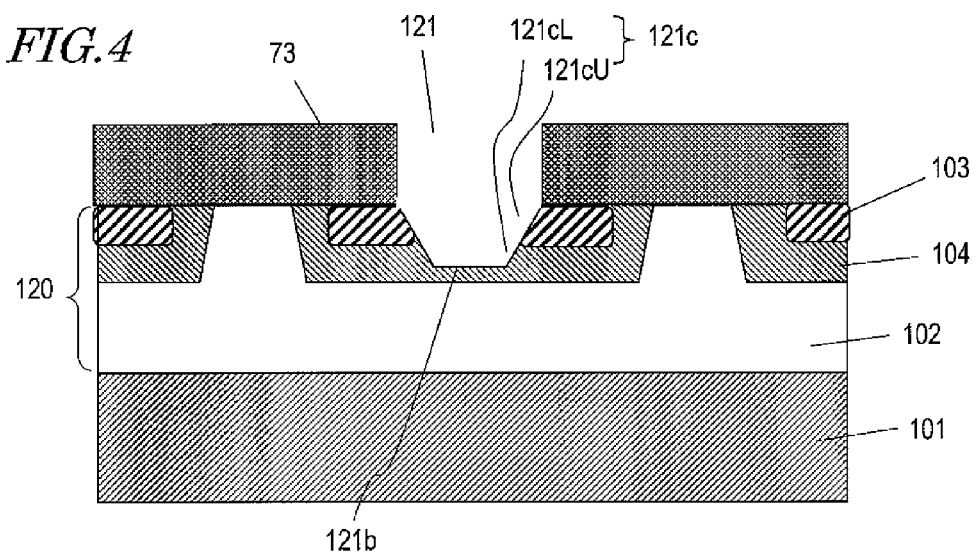
FIG. 4 is a step-by-step cross-sectional view illustrating the method for manufacturing a semiconductor device of the first embodiment.

Next, as shown in FIG. 4, after the implantation mask patterns 71a and 71b and the first implantation mask 72 are removed, the third implantation mask 73 is formed. The implantation mask patterns 71a and 71b are removed with an HF aqueous solution as they are made of an oxide film, for example, and the first implantation mask 72 is removed with a mixed solution of HF, $HNO_3$ and $H_2O$ as it is made of a polysilicon.

The first silicon carbide layer 120 is dry-etched using the third implantation mask 73, thereby forming the contact trench 121. A mixed gas of $CF_4$ and $O_2$, for example, is used in this etching. The contact trench 121 is arranged so as to penetrate through the first impurity region 103 to reach the body region 104. Therefore, the first impurity region 103 is exposed on the side wall upper portion 121cU of the contact trench 121, and the body region 104 is exposed on the side wall lower portion 121cL and the bottom surface 121b of the contact trench 121.

Preferably, so-called "tapered etching" is performed such that the area of the opening 121a of the contact trench 121 is greater than the area of the bottom surface 121b. Then, the side wall 121c of the contact trench 121 is non-vertical with respect to the upper surface 120a of the first silicon carbide layer 120, allowing for an increase in the area of the side wall 121c. In order to perform tapered etching, for example, etching is performed at a pressure of 1.5 Pa while introducing $Cl_2$, HBr and $O_2$ at flow rates of 70 sccm, 50 sccm and 2 sccm, respectively, and applying an ICP bias of 600 W and a DC bias of 150 W. The depth of the contact trench 121 is preferably greater than the first impurity region 103, and is 0.4 µm, for example.

Figure 5:
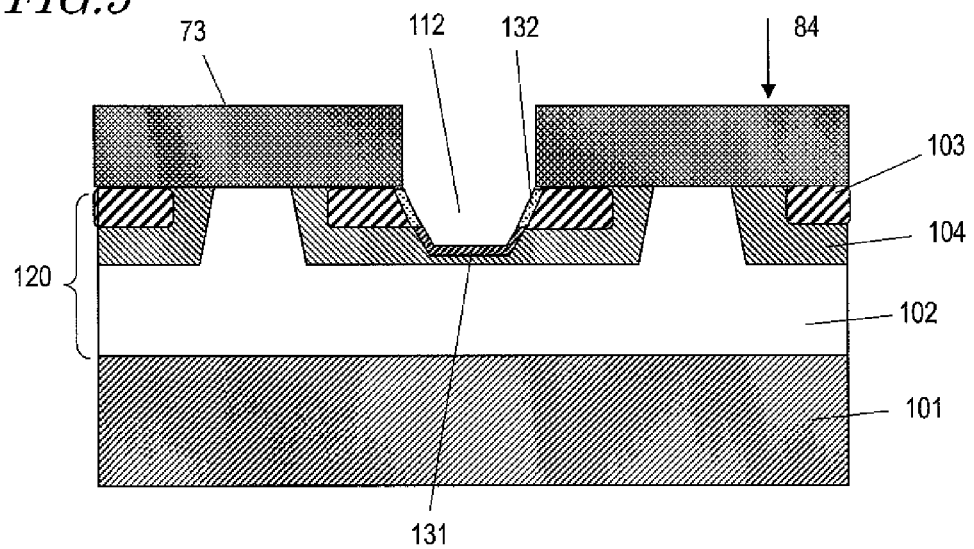
FIG. 5 is a step-by-step cross-sectional view illustrating the method for manufacturing a semiconductor device of the first embodiment.

Next, as shown in FIG. 5, a p-type impurity ion 84 is implanted into the first impurity region 103 and the body region 104 exposed in the contact trench 121 from the side wall 121c and the bottom surface 121b of the contact trench 121 using the third implantation mask 73 as a mask. For example, $Al^+$ (aluminum ion) or $B^+$ (boron ion) is used as the impurity ion 84. Thus, the second impurity region 132 is formed along the side wall upper portion 121cU of the contact trench 121. The contact region 131 is formed along the side wall lower portion 121cL and the bottom surface 121b. In the second impurity region 132, the impurity of the first conductivity type, which was contained in that region before the implantation, and the implanted impurity of the second conductivity type cancel out each other. Therefore, the second impurity region 132 becomes a first conductivity type region of a lower concentration than before the implantation, or a second conductivity type region.

In the present embodiment, the implantation is performed with an energy of 30 keV while keeping the temperature of the substrate 101 at 500° C., for example. The depth of the contact region 131 is preferably determined so that the impurity concentration is highest at the interface at which it contacts the first ohmic electrode 122 to be formed later. The first ohmic electrode 122 is formed by alloying between a metal and silicon carbide, and in this process, a thickness of silicon carbide generally equal to the thickness of the metal is alloyed. Therefore, if the thickness of the metal for forming the first ohmic electrode 122 is 100 nm, the depth of the contact region 131 is preferably also about 100 nm or more (greater than or equal to the thickness of the metal). More preferably, it is 150 nm or more (1.5 times or more the thickness of the metal). Thus, a portion of the contact region 131 is more reliably left unalloyed after the alloying process described above.

In the present embodiment, since the side wall 121c is inclined so as to face the opening 121a, the contact region 131 can be formed at once both in a region of the drift region 102 that is exposed on the side wall 121c and a region thereof that is exposed on the bottom surface 121b, by performing ion implantation vertically with respect to the upper surface 120a. However, if the side wall 121c is vertical to the upper surface 120a, the semiconductor substrate 101 may be rotated while being inclined at a certain angle (e.g., 30°) with respect to the direction vertical to the upper surface 120a, or four iterations of implantation may be performed while rotating it by 90° each time.

After the third implantation mask 73 is removed, the semiconductor substrate 101 (more accurately, various regions of the first silicon carbide layer 120) is subjected to activation annealing (not shown) at a temperature of 1000° C. or more (herein, 1800° C.). This activates the impurity ions implanted into the various regions of the first silicon carbide layer 120.

Figure 6:
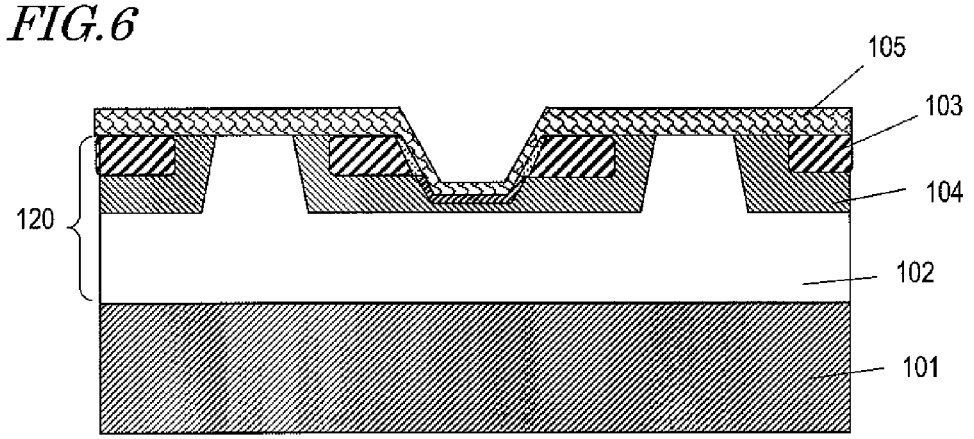
FIG. 6 is a step-by-step cross-sectional view illustrating the method for manufacturing a semiconductor device of the first embodiment.

Next, as shown in FIG. 6, the second silicon carbide layer 105 is formed in the upper surface 120a of the first silicon carbide layer 120 and the contact trench 121. The second silicon carbide layer 105 in the present embodiment is formed by SiC. For example, the second silicon carbide layer 105 is formed by a thermal CVD method using silane ($SiH_4$) and propane ($C_3H_8$) as material gases, hydrogen ($H_2$) as a carrier gas, and a nitrogen ($N_2$) gas as a dopant gas. The impurity concentration of the second silicon carbide layer 105 is $1 \times 10^{15}$ cm$^{-3}$ to $5 \times 10^{15}$ cm$^{-3}$, and the thickness thereof is 30 nm to 150 nm. A nitrogen ($N_2$) gas may be introduced during the growth of the second silicon carbide layer 105 so that a portion of the second silicon carbide layer 105 has a higher concentration.

Figure 7:
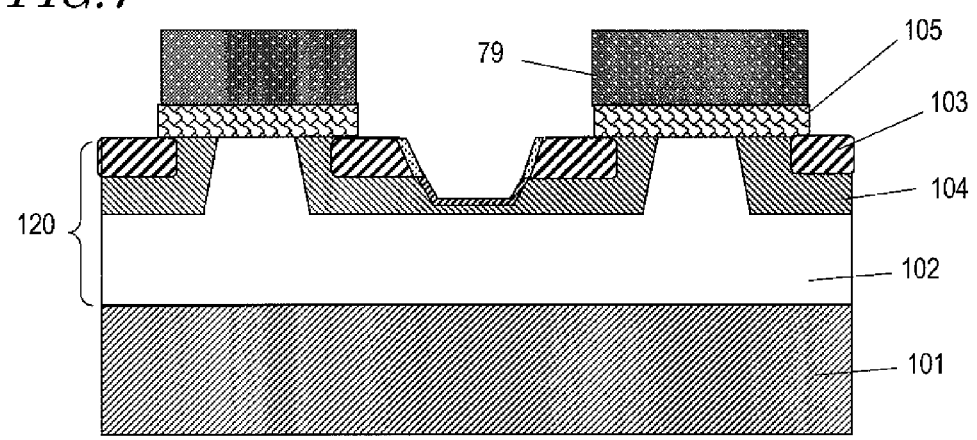
FIG. 7 is a step-by-step cross-sectional view illustrating the method for manufacturing a semiconductor device of the first embodiment.

Next, as shown in FIG. 7, a photoresist 79 is formed on the second silicon carbide layer 105, and then the second silicon carbide layer 105 is etched using the photoresist 79 as a mask. The etching of the second silicon carbide layer 105 is performed by dry etching using a mixed gas of $CF_4$ and $O_2$, for example.

Figure 8:
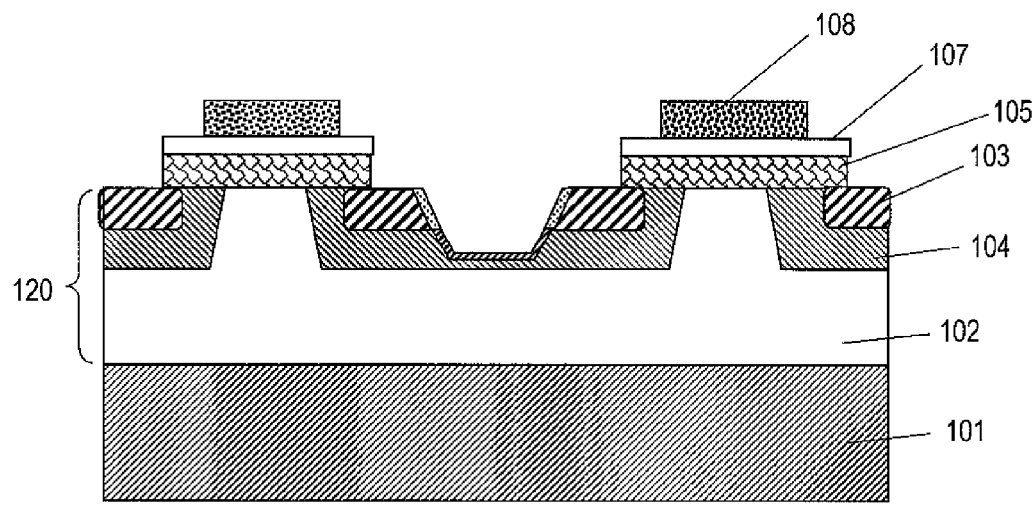
FIG. 8 is a step-by-step cross-sectional view illustrating the method for manufacturing a semiconductor device of the first embodiment.

Next, as shown in FIG. 8, after the photoresist 79 is removed, the gate insulating film ($SiO_2$) 107 is formed on the second silicon carbide layer 105, and then the gate electrode (poly-Si) 108 is formed on the gate insulating film 107. Then, a photoresist (not shown) is formed on the gate electrode 108, the gate electrode 108 is etched, and the photoresist is removed.

Figure 9:
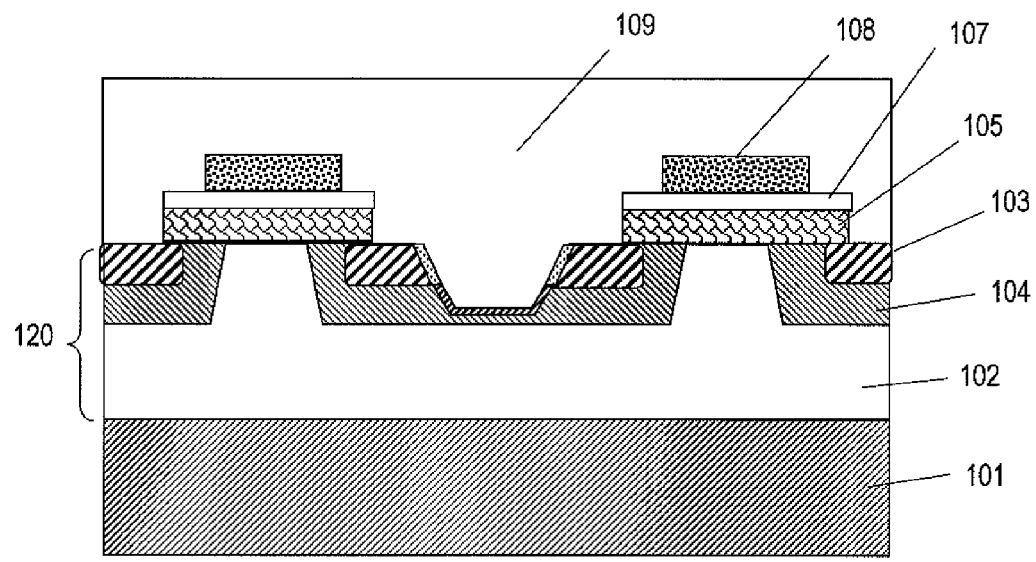
FIG. 9 is a step-by-step cross-sectional view illustrating the method for manufacturing a semiconductor device of the first embodiment.

Next, as shown in FIG. 9, the interlayer insulating film 109 is formed on the first silicon carbide layer 120 so as to cover the gate electrode 108 and the second silicon carbide layer 105. The interlayer insulating film 109 is made of silicon oxide ($SiO_2$), for example, and the thickness thereof is 1000 nm, for example.

Figure 10:
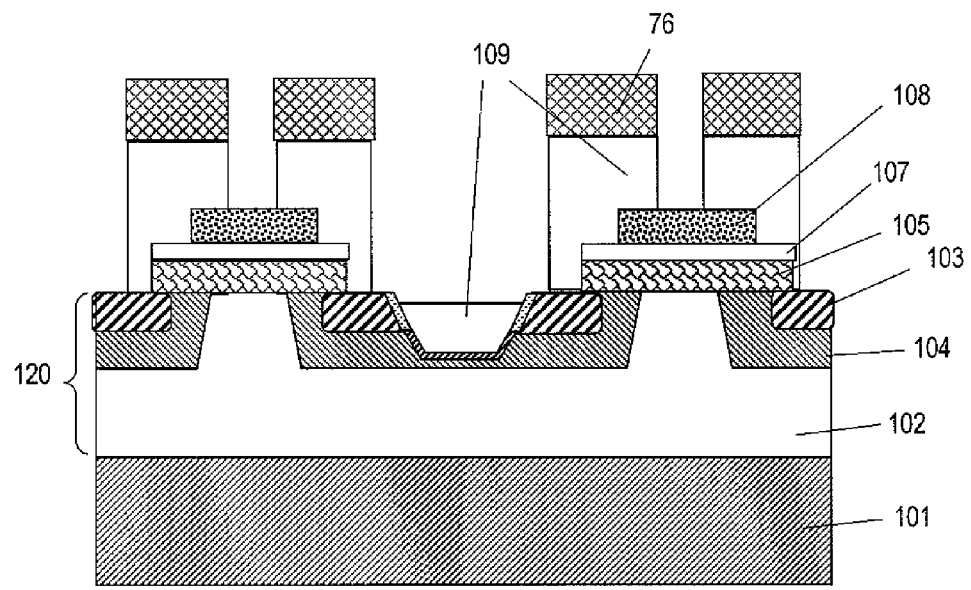
FIG. 10 is a step-by-step cross-sectional view illustrating the method for manufacturing a semiconductor device of the first embodiment.

Next, as shown in FIG. 10, the interlayer insulating film 109 is etched using the photoresist 76 as a mask. The etching of the interlayer insulating film 109 is performed by dry etching using a mixed gas of $CHF_3$ and $O_2$, for example. Note however that with only the dry etching, it is difficult to etch as far as the inside of the trench formed for well contact.

Figure 11:
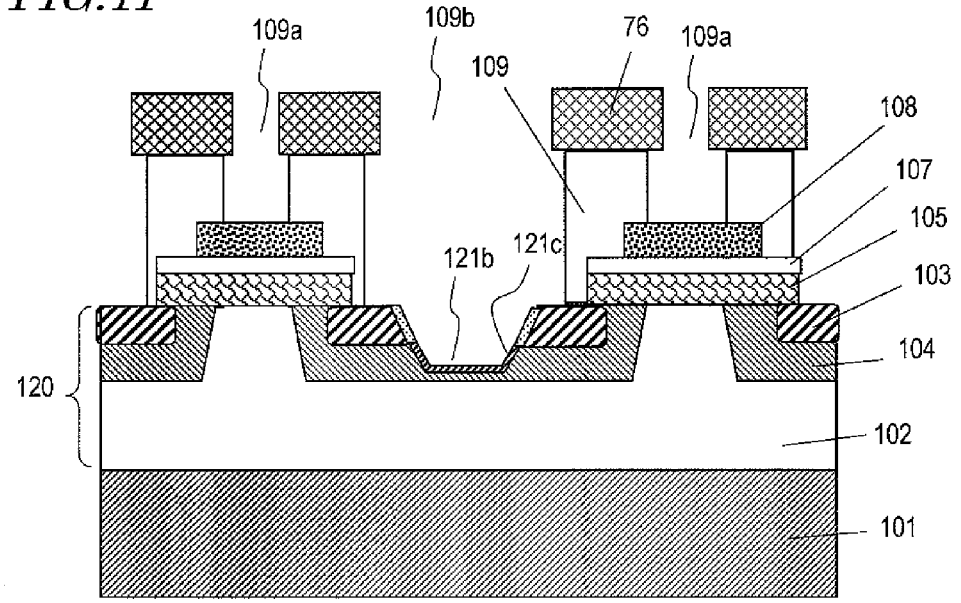
FIG. 11 is a step-by-step cross-sectional view illustrating the method for manufacturing a semiconductor device of the first embodiment.

Therefore, as shown in FIG. 11, in order to remove the interlayer insulating film 109 in the contact trench 121, wet etching using BHF, or the like, for example, or isotropic etching using a $CF_4$ gas, or the like, is also performed. Thus, there are formed the contact hole 109a, through which the gate electrode 108 is exposed, and the contact hole 109b, through which the bottom surface 121b and the side wall 121c of the contact trench 121 are exposed.

Figure 12:
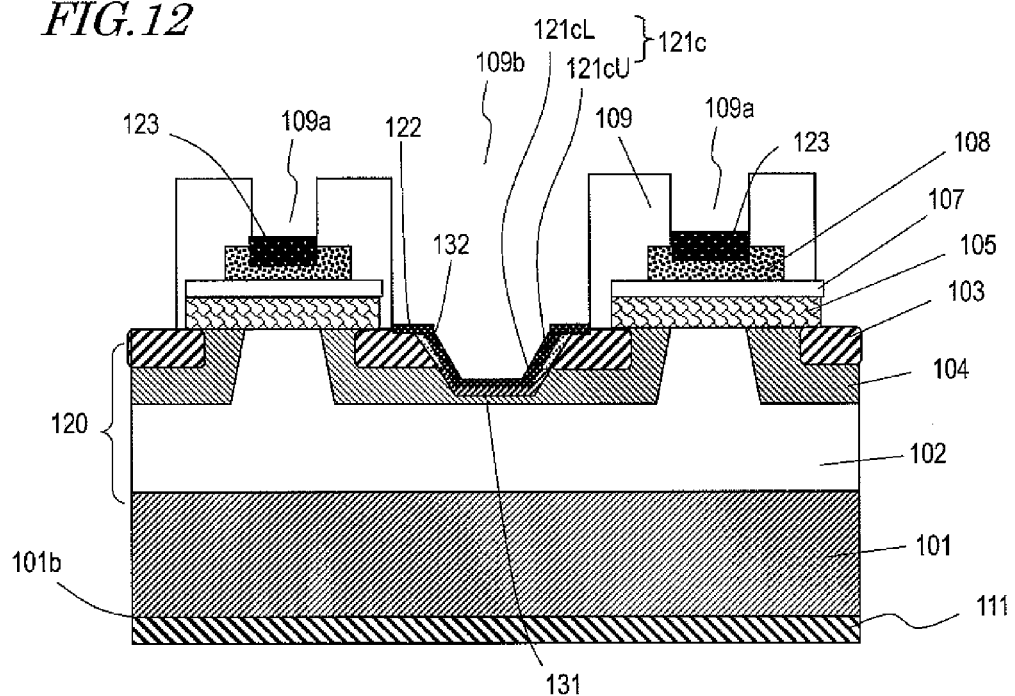
FIG. 12 is a step-by-step cross-sectional view illustrating the method for manufacturing a semiconductor device of the first embodiment.

Next, as shown in FIG. 12, after the photoresist 76 is removed, a contact metal (titanium (Ti) or nickel (Ni)) is deposited in the contact hole 109a and the contact hole 109b, and a heat treatment is performed. For example, where the contact metal is made of Ti, a heat treatment at 950° C. is performed after the deposition of Ti. Thus, in the contact hole 109b, the contact metal reacts (silicifies) with silicon carbide, thereby forming a metal silicide at the interface between the contact metal and the silicon carbide layer 120. Herein, the contact region 131, the second impurity region 132 and a portion of the first impurity region 103 are alloyed with the contact metal. In the contact hole 109a, the contact metal and polysilicon react with each other, thereby forming a metal silicide at the interface therebetween. Then, a portion of the contact metal left unsilicified (the unreacted contact metal) is removed. Thus, the first ohmic electrode 122 containing a metal silicide is formed in the contact hole 109b, and the metal silicide layer 123 is formed on the gate electrode 108 in the contact hole 109a.

In the present embodiment, the first ohmic electrode 122 is formed in the contact trench 121 and on the upper surface 120a of the first silicon carbide layer 120. The first ohmic electrode 122 is in contact with the contact region 131 on the bottom surface 121b and the side wall lower portion 121cL of the contact trench 121, and is in contact with the second impurity region 132 on the side wall upper portion 121cU. It is also in contact with the upper surface of the first impurity region 103 on the upper surface 120a of the first silicon carbide layer 120.

In this process, all of the second impurity region 132 may be alloyed to be the first ohmic electrode 122. In such a case, the first ohmic electrode 122 and the first impurity region 103 can be brought into contact with each other also on the side wall upper portion 121cU of the contact trench 121, thereby increasing the contact area therebetween.

A metal is deposited on the reverse surface 101b of the semiconductor substrate 101 and a heat treatment is performed, thereby forming the second ohmic electrode 111. It is formed by, for example, performing a heat treatment at 950° C. after depositing Ti.

Figure 13:
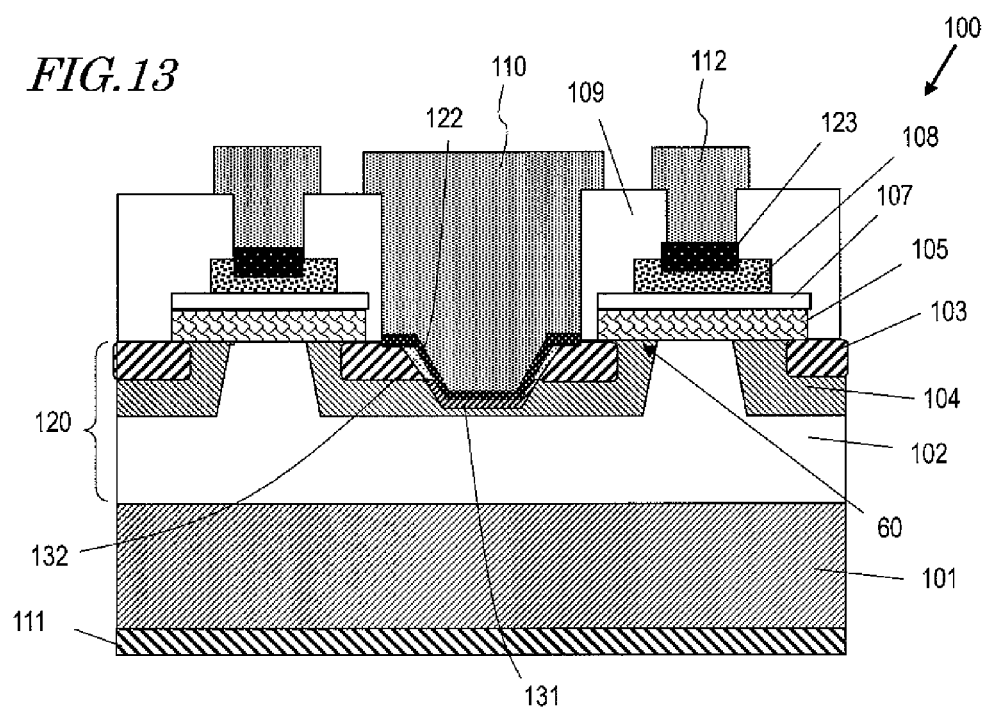
FIG. 13 is a step-by-step cross-sectional view illustrating the method for manufacturing a semiconductor device of the first embodiment.

Lastly, as shown in FIG. 13, the interconnects 112 and 110 are formed in the contact holes 109a and 109b, respectively, so as to be in contact with the first ohmic electrode 122 and the metal silicide layer 123. Thus, the semiconductor device 100 is completed.

Second Embodiment

A second embodiment of the present invention will now be described with reference to the drawings.

FIG. 14(a) is a schematic cross-sectional view of a semiconductor device 200 according to the second embodiment of the present invention, and FIG. 14(b) is an enlarged cross-sectional view showing the contact trench structure of the semiconductor device 200.

In the semiconductor device 200, the side wall lower portion 121cL of the contact trench 121 is more inclined than the side wall upper portion 121cU. The second impurity region 132 (FIG. 1) is not provided along the side wall upper portion 121cU. The first ohmic electrode 122 is in contact with the first impurity region 103 on the upper surface 120a of the first silicon carbide layer 120 and the side wall upper portion 121cU of the contact trench 121. Otherwise, the configuration is similar to the configuration shown in FIG. 1.

In the present embodiment, as in the preceding embodiment, it is possible to increase the contact area between the contact region 131 and the first ohmic electrode 122, and to reduce the contact resistance between the first ohmic electrode 122 and the body region 104. Since the semiconductor device 200 does not include a second impurity region, the resistance between the first impurity region 103 and the first ohmic electrode 122 can be suppressed to be lower.

(Method For Manufacturing Semiconductor Device of Second Embodiment)

Figure 15:
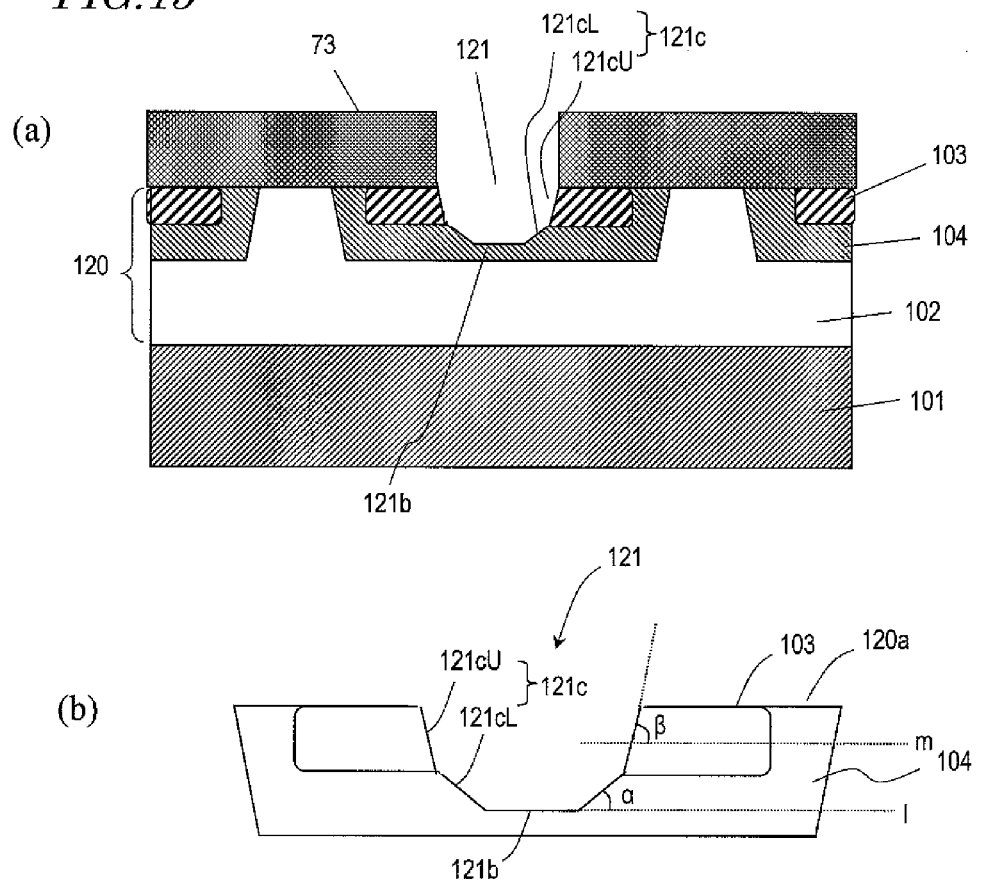
FIG. 15 (a) is a step-by-step cross-sectional view illustrating a method for manufacturing a semiconductor device of the second embodiment, and (b) is an enlarged cross-sectional view illustrating the inclination angle of the side wall of the contact trench.

Hereinafter, referring to FIG. 15, an example of a method for manufacturing the semiconductor device 200 of the present embodiment will be described.

First, by a method similar to the method described above with reference to FIGS. 2 to 4, the first impurity region 103 and the body region 104 are formed in the first silicon carbide layer 120.

Then, as shown in FIG. 15(a), the third implantation mask 73 is formed on the first silicon carbide layer 120. The first silicon carbide layer 120 is dry-etched using the third implantation mask 73, thereby forming the contact trench 121. In this process, the etching conditions are adjusted so that the inclination angle α of the side wall lower portion 121cL of the contact trench 121 and the inclination angle β of the side wall upper portion 121cU are both less than 90 degrees, and that the inclination angle α is smaller than the inclination angle β. As shown in FIG. 15(b), the "inclination angle α" is the angle formed between the plane l parallel to the upper surface 120a of the first silicon carbide layer 120 and the side wall lower portion 121cL, and the "inclination angle β" is the angle formed between the plane m parallel to the upper surface 120a and the side wall upper portion 121cU. Herein, the upper surface 120a of the first silicon carbide layer 120 is generally parallel to the principal surface of the semiconductor substrate 101.

For example, the inclination angle β of the side wall upper portion 121cU and the inclination angle α of the side wall lower portion 121cL can be made to differ from each other by adjusting the types of etching gases and the mixing ratio therebetween to be used in the formation of the contact trench 121, for example. Herein, for example, when the side wall upper portion 121cU is etched, the etching is performed at a pressure of 1.5 Pa while introducing $Cl_2$, HBr, and $O_2$ at flow rates of 10 sccm, 20 sccm and 20 sccm, respectively, and applying an ICP bias of 600 W and a DC bias of 150 W. The side wall lower portion 121cL is etched, the etching is performed at a pressure of 1.5 Pa while introducing $Cl_2$, 113r and $O_2$ at flow rates of 10 sccm, 20 sccm and 5 sccm, respectively, and applying an ICP bias of 600 W and a DC bias of 150 W. Thus, in a case in which an etching gas (e.g., a mixed gas of $Cl_2$, HBr and $O_2$) containing a gas that easily forms a deposit is used, the etching in the lateral direction is more suppressed and the trench side wall is closer to the vertical direction as the oxygen ratio in the etching gas is increased. Therefore, by varying the oxygen ratio, the inclination angle can be varied between the side wall upper portion 121cU and the side wall lower portion 121cL. Thus, the contact trench 121 is obtained in which the inclination angle α is 45-75 degrees and the inclination angle β is 80-85 degrees, for example.

Figure 16:
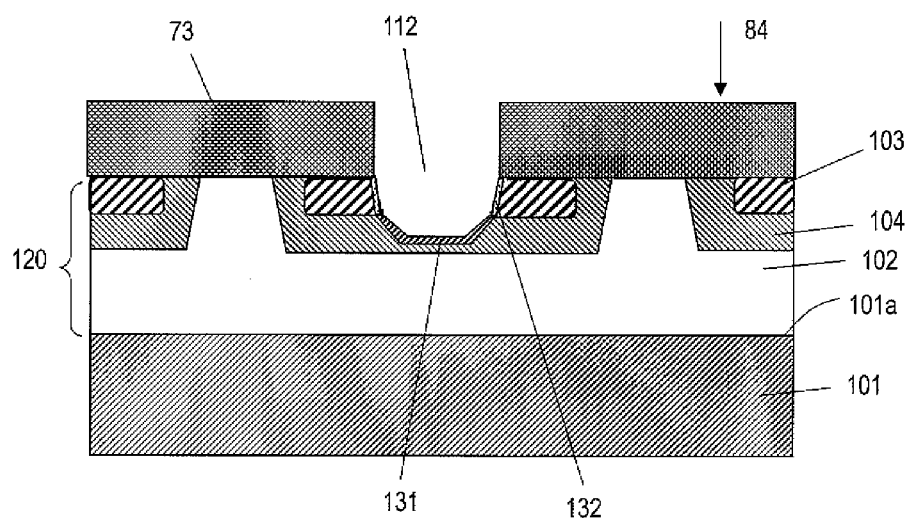
FIG. 16 is a step-by-step cross-sectional view illustrating another method for manufacturing a semiconductor device of the second embodiment.

Then, as shown in FIG. 16, using the third implantation mask 73, the impurity ion 84 is implanted into the first impurity region 103 and the body region 104 exposed in the contact trench 121 from the direction vertical to the principal surface 101a of the semiconductor substrate 101. For example, $Al^+$ (aluminum ion) or $B^+$ (boron ion) is used as the impurity ion 84. Thus, the second impurity region 132 is formed along the side wall upper portion 121cU of the contact trench 121. The contact region 131 is formed along the side wall lower portion 121cL and the bottom surface 121b.

In this ion implantation step, since the inclination angle β of the side wall upper portion 121cU is large, the impurity ion 84 coming from the direction vertical to the principal surface 101a of the semiconductor substrate 101 is unlikely implanted into the first impurity region 103 through the side wall upper portion 121cU. Thus, the thickness of the second impurity region 132 is smaller than the thickness of the contact region 131.

Thereafter, a contact metal is deposited in the contact trench 121 and silicified. In this process, by adjusting the thickness of the contact metal, the entire (or generally entire) second impurity region 132 can be alloyed while a portion of the contact region 131 is left unalloyed. As a result, since the entire second impurity region 132 becomes the first ohmic electrode, the first impurity region 103 and the first ohmic electrode can be brought into contact with each other on the side wall upper portion 121cU of the contact trench 121.

With the method described above, it is possible, without increasing the number of manufacturing steps, to form the contact region 131 while suppressing the resistance between the first impurity region 103 and the first ohmic electrode 122 to be low.

The configuration of the semiconductor device of the present embodiment is not limited to those shown in FIG. 1 and FIG. 14. While the semiconductor devices 100 and 200 described above have a MISFET structure, they may have an IGBT (Insulated Gate Bipolar Transistor) structure. In such a case, the first impurity region 103 is an emitter or a collector, the first ohmic electrode 122 is an emitter electrode or a collector electrode, and the second ohmic electrode 111 is a collector electrode or an emitter electrode.

Third Embodiment

Hereinafter, referring to the drawings, a semiconductor device according to a third embodiment of the present invention will be described. Although a vertical-type silicon carbide MISFET will be illustrated herein, the semiconductor device of the present invention is not limited to the illustrated example as long as it includes a silicon carbide layer, and an ohmic electrode that forms an ohmic contact with the silicon carbide layer.

In subsequent figures, elements having substantially the same function as those of the conventional semiconductor device (FIG. 37) are denoted by the same reference numerals. The first conductivity type may be either the n type or the p type, and the second conductivity type is a conductivity type (the p type or the n type) that is different from the first conductivity type.

FIG. 17(a) schematically shows a cross-sectional structure of a semiconductor device 300 of the present embodiment. The semiconductor device 300 is supported by the semiconductor substrate 101 having the principal surface 101a and the reverse surface 101b. In the present embodiment, a semiconductor substrate of the first conductivity type containing silicon carbide is used as the semiconductor substrate 101. The first silicon carbide layer 120 is formed on the principal surface 101a of the semiconductor substrate 101. In the present embodiment, the first silicon carbide layer 120 is a silicon carbide epitaxial layer formed by epitaxially growing silicon carbide on the principal surface 101a of the semiconductor substrate 101. Formed in the surface region of the first silicon carbide layer 120 are the first impurity region 103 of the first conductivity type, and the body region 104 of the second conductivity type arranged so as to be adjacent to the first impurity region 103. Herein, the first impurity region 103 is arranged so as to be surrounded by the body region 104 on the upper surface 120a of the first silicon carbide layer 120. The impurity concentration of the first impurity region 103 is higher than the impurity concentration of the semiconductor substrate 101. The drift region 102 of the first conductivity type is formed in a region of the first silicon carbide layer 120 other than the body region 104 and the first impurity region 103. The impurity concentration of the drift region 102 is lower than the impurity concentration of the semiconductor substrate 101.

In the body region 104, a contact region 202 of the second conductivity type is formed in contact with the body region 104 and having a higher impurity concentration than the body region 104. At least a portion of the contact region 202 is arranged deeper than the first impurity region 103. In the present specification, the "depth" of each region formed in the first silicon carbide layer 120 means the depth from the upper surface 120a of the first silicon carbide layer 120.

More specifically, the body region 104 is formed in a region of the first silicon carbide layer 120 from the upper surface 120a to a predetermined depth, and the first impurity region 103 is formed in a region of the body region 104 from the upper surface 120a to a predetermined depth. The bottom portion of the first impurity region 103 is shallower than the position of the bottom portion of the body region 104, and the first impurity region 103 is not protruding out of the body region 104. The body region 104 and the first impurity region 103 are exposed on the upper surface 120a of the first silicon carbide layer 120. The contact region 202 is provided in the body region 104 at a position deeper than the bottom surface of the first impurity region 103.

FIG. 17(b) is an enlarged cross-sectional view of the body region 104. As shown in as shown in FIG. 17(b), a contact trench 301 is provided in the first silicon carbide layer 120. The contact trench 301 penetrates through the first impurity region 103 to reach the contact region 202. A bottom surface 301B of the contact trench 301 is deeper than the bottom surface of the first impurity region 103 and the upper surface of the contact region 202, and is shallower than the bottom surface of the contact region 202. Although the contact region 202 may be formed to be in contact with (to partially overlap) the first impurity region 103 located thereon, it is preferably arranged at a position deeper than the bottom surface of the first impurity region 103 and not in contact with the first impurity region 103. If the contact region 202 is arranged at a position deeper than the bottom surface of the first impurity region 103, not only the bottom surface of the contact region 202, but also the entire side surface, can be brought into contact with the body region 104.

In the contact trench 301, the first ohmic electrode 122 is provided. The first ohmic electrode 122 is in contact with the contact region 202 on the bottom surface 301B of the contact trench 301 and a portion of a side wall 301S thereof. In the illustrated example, the ohmic electrode 122 forms an ohmic contact with the first impurity region 103 on a portion (side wall upper portion) $301S_1$ of the side wall 301S of the contact trench 301 that is located at the same level or shallower than the bottom surface of the first impurity region 103. The first ohmic electrode 122 forms an ohmic contact with the contact region 202 on the bottom surface 301B of the contact trench 301 and a portion (side wall lower portion) $301S_2$ of the side wall 301S of the contact trench 301 that is located deeper than the bottom surface of the first impurity region 103. The first ohmic electrode 122 does not need to be in contact with the contact region 202 across the entire side wall lower portion $301S_2$. For example, it may be in contact with the contact region 202 only on a portion of the side wall lower portion $S_2$ (a portion located in the vicinity of the bottom surface 301B).

It is preferred that the bottom surface 301B of the contact trench 301 is located inside the contour of the contact region 202 as seen from the direction vertical to the principal surface 101a of the semiconductor substrate 101. Then, it is possible to more reliably ensure the contact area between the first ohmic electrode 122 and the contact trench 301 without increasing the chip area.

In the present embodiment, at least a portion of the first impurity region 103 overlaps the contact region 202 as seen from the direction vertical to the principal surface 101a of the semiconductor substrate 101. More specifically, a portion of the contact region 202 that is located around the bottom surface 301B of the contact trench 301 overlaps the first impurity region 103 as seen from the direction vertical to the principal surface 101a of the semiconductor substrate 101. The overlapping portion has an upper surface generally parallel to the principal surface 101a of the semiconductor substrate 101, and is thicker than the portion located below the bottom surface 301B of the contact trench 301.

The semiconductor device 300, including the contact trench 301 having such a structure, has the following advantages. The first ohmic electrode 122 is in contact with the first impurity region 103 on the side wall upper portion $301S_1$ of the contact trench 301, and at a position deeper than the bottom surface of the first impurity region 103, the first ohmic electrode 122 is in contact with the contact region 202 not only on the bottom surface 301B of the contact trench 301 but also on the side wall lower portion $301S_2$. Therefore, it is possible to increase the contact area between the contact region 202 and the first ohmic electrode 122 while ensuring the contact area between the first impurity region 103 and the first ohmic electrode 122. Therefore, it is possible to realize a low ON resistance by decreasing the contact resistance of the first ohmic electrode 122 for the first impurity region 103. Since the contact resistance of the first ohmic electrode 122 for the body region 104 can be reduced, the potential of the body region 104 can be matched with the potential of the first ohmic electrode 122 at a very high speed. Therefore, it is possible to suppress the delay in potential variation of the body region 104 and increase the switching speed of the semiconductor device 300.

With the conventional semiconductor device (FIG. 37), it was necessary to from the contact region 202 so as to extend from the surface of the first silicon carbide layer 120 across the thickness of the first impurity region 103. According to the present embodiment, the contact region 202 does not need to be arranged in the first impurity region 103, and it only needs to be formed in the body region 104. Therefore, the number of iterations of ion implantation for the formation of the contact region 202 can be smaller than that with the conventional technique. Thus, it is possible to shorten the amount of time required for manufacturing the semiconductor device and reduce the manufacturing cost.

It is preferred that at least a portion of the side wall 301S of the contact trench 301 is non-vertical with respect to the upper surface 120a of the first silicon carbide layer 120. Then, as compared with a case in which the side wall 301S of the contact trench 301 is vertical to the upper surface 120a, it is possible to increase the contact area between the contact region 202 and the first impurity region 103 and the first ohmic electrode 122.

In order to more reliably bring the first ohmic electrode 122 and the first impurity region 103 into contact with each other, the side wall 301S of the contact trench 301 is preferably inclined with respect to the normal to the upper surface 120a in such a direction that the area of the opening of the contact trench 301 is greater than the area of the bottom surface 301B. The inclination angle of the side wall 301S of the contact trench 301 with respect to the upper surface 120a of the first silicon carbide layer 120 is preferably 45 degrees or more and 85 degrees or less. Then, it is possible to more effectively increase the contact area between the contact region 202 and the first impurity region 103 and the first ohmic electrode 122 while suppressing the increase in the chip area.

In order to reduce the chip area, the lengths (the amounts of protrusion) W1 and W2 of portions of the contact region 202 that laterally protrude from the end portions of the bottom surface of the contact trench 301 are preferably small on a cross section shown in FIG. 17(b) (an arbitrary cross section vertical to the principal surface 101a of the semiconductor substrate 101). The amounts of protrusion W1 and W2 denote distances, parallel to the principal surface 101a of the semiconductor substrate 101, between the opposite end portions of the bottom surface 301B of the contact trench 301 and the side surfaces of the contact region 202 in the vicinity of the opposite end portions, on the cross section described above. Where the contact trench 301 is formed by mask alignment, there is a limit on the reduction in the amounts of protrusion W1 and W2 because it is necessary to design while taking into consideration the misalignment. Therefore, the contact trench 301 is preferably formed in a self-aligned manner with respect to the contact region 202, as will be described later. Using such a self-aligned process, the amounts of protrusion W1 and W2 are generally equal to each other. In other words, the bottom surface 301B of the contact trench 301 is arranged generally at the center of the contour of the contact region 202 as seen from the direction vertical to the principal surface 101a of the semiconductor substrate 101, as illustrated in FIG. 17(c), for example.

A region of the drift region 102 that is sandwiched between adjacent body regions 104 is referred to as the JFET (Junction Field-Effect Transistor) region 60. The semiconductor device 300 controls the current in a path extending from the first impurity region 103 provided in the body region 104 via the JFET region 60 to the reverse surface 101b of the semiconductor substrate 101. Thus, the semiconductor device 300 at least includes the gate insulating film 107 provided above a region (hereinafter referred to as the "partial region of the body region 104") 40 of the body region 104 that is located between the first impurity region 103 and the JFET region 60, and the gate electrode 108 provided on the gate insulating film 107, and the current control described above is performed by the voltage applied between the first ohmic electrode 122 and the gate electrode 108. Then, as described above, the potential of the partial region 40 of the body region 104 can be matched with the potential of the first ohmic electrode 122 at a very high speed. Therefore, it is possible to operate the semiconductor device 300 without causing a delay with respect to the switching by the voltage applied between the first ohmic electrode 122 and the gate electrode 108.

For such reasons, the semiconductor device 300 may include either an accumulation channel or an inversion channel as long as it is possible to perform the current control by the voltage applied to the gate electrode 108. In the present embodiment, the semiconductor device 300 further includes the second silicon carbide layer 105 arranged in contact with the partial region 40 of the body region 104 between the partial region 40 and the gate insulating film 107, the partial region 40 being located between the first impurity region 103 and the JFET region 60. The second silicon carbide layer 105 is an epitaxial layer, for example, and functions as an accumulation channel. On the upper surface 120a of the first silicon carbide layer 120, the second silicon carbide layer 105 extends over the partial region 40 of the body region 104 so as to be in contact with the first impurity region 103 and the drift region 102. With a semiconductor device having an inversion channel, the gate insulating film 107 is arranged so as to be in direct contact with the partial region 40 of the body region 104.

The interlayer insulating film 109 is provided so as to cover the upper surface 120a of the first silicon carbide layer 120, and the contact hole 109a exposing the gate electrode 108 and the contact hole 109b exposing the first ohmic electrode 122 are provided in the interlayer insulating film 109.

The interconnect 112 is provided in the contact hole 109a, and the interconnect 112 is electrically connected to the gate electrode 108. In the present embodiment, the metal silicide layer 123 is provided between the interconnect 112 and the gate electrode 108. The interconnect 110 is provided in the contact hole 109b, and the interconnect 110 is in contact with, and electrically connected to, the first ohmic electrode 122. A second ohmic electrode 111 is provided on the reverse surface 101b of the semiconductor substrate 101.

The semiconductor device 300 of the present embodiment is a power semiconductor device formed by an SiC semiconductor, and is suitably used in applications with a high withstand voltage, a large current, and a high operating speed. An example of a specific configuration of the present embodiment will be shown below.

In an example of the present embodiment, the first conductivity type is the n type and the second conductivity type is the p type. The first ohmic electrode 122 is the source electrode, and the second ohmic electrode 111 is the drain electrode. The first impurity region 103 is the source region.

The semiconductor substrate 101 is formed by a hexagonal silicon carbide. The thickness of the semiconductor substrate 101 is 250 µm to 350 µm, for example, and the impurity concentration of the semiconductor substrate 101 is $8 \times 10^{18}$ cm$^{-3}$ (n$^+$), for example. Where the impurity concentration is set to be low, a substrate formed by a cubic silicon carbide may be used as the semiconductor substrate 101.

The first silicon carbide layer 120 is formed by epitaxial growth on the principal surface 101a of the semiconductor substrate 101. The thickness of the first silicon carbide layer 120 is 4 µm to 15 µm, for example, and the impurity concentration is $5 \times 10^{15}$ cm$^{-3}$ (n$^-$), for example. Another epitaxial layer (e.g., an SiC layer having a concentration of $6 \times 10^{16}$ cm$^{-3}$) may be provided between the semiconductor substrate 101 and the first silicon carbide layer 120.

The thickness of the body region 104 (i.e., the depth from the upper surface 120a of the first silicon carbide layer 120 to the bottom surface of the body region 104) is 0.5 µm to 1.0 µm, for example, and the impurity concentration of the body region 104 is $1.5 \times 10^{18}$ cm$^{-3}$ (p$^-$), for example. The thickness of the first impurity region 103 (i.e., the depth from the upper surface 120a to the bottom surface of the first impurity region 103) is 0.4 µm, for example, and the impurity concentration of the first impurity region 103 is $5 \times 10^{19}$ cm$^{-3}$ (n$^{++}$), for example.

The upper surface of the contact region 202 is located at a depth of 0.45 µm from the upper surface 120a of the first silicon carbide layer 120, and the bottom surface of the contact region 202 is located at a depth of 0.45-0.9 µm from the upper surface 120a. The concentration of the contact region 202 is $2 \times 10^{20}$ cm$^{-3}$ (p$^+$), for example. The bottom surface 301B of the contact trench 301 is located at a depth of about 0.44-0.85 µm from the upper surface 120a of the first silicon carbide layer 120, and is shallower than the bottom portion of the body region 104. The length Dj of the JFET region 60 on the upper surface 120a of the first silicon carbide layer 120 is 3 µm, for example, and the length Dc of the partial region 40 of the body region 104 is 0.5 µm, for example.

The second silicon carbide layer 105 is formed by epitaxial growth on the first silicon carbide layer 120. The thickness of the second silicon carbide layer 105 is 30 nm to 150 nm, for example. The concentration of the second silicon carbide layer 105 is $2 \times 10^{18}$ cm$^{-3}$ (n$^-$), for example.

The gate insulating film 107 may be an oxide film, an oxynitride film, or a layered film thereof. Herein, it is formed by SiO$_2$ (silicon oxide), for example. The thickness of the gate insulating film 107 is 70 nm, for example. The gate electrode 108 is formed by poly-Si (polysilicon), for example, and the thickness thereof is 500 nm, for example.

The first ohmic electrode 122 is formed by an alloy between Ni (nickel) and Si (silicon), and the thickness thereof is 50 nm, for example. The first ohmic electrode 122 may be formed by an alloy between Ti (titanium) and Si (silicon). The second ohmic electrode 111 is also formed by an alloy between Ti (titanium) and Si (silicon), or an alloy between Ni (nickel) and Si (silicon), for example, and the thickness thereof is 100 nm, for example. Ni and Ag, or Ni and Au, may be deposited on the second ohmic electrode 111 so as to facilitate the soldering when the semiconductor device 300 is encapsulated in a plastic package.

While a case where the first conductivity type is the n conductivity type and the second conductivity type is the p conductivity type in the semiconductor device 300 has been illustrated above, the first conductivity type may be the p conductivity type and the second conductivity type may be the n conductivity type. While the semiconductor device 300 shown in FIG. 17 is a planar-type MISFET, the semiconductor device of the present embodiment may be a MISFET of the trench gate structure. Moreover, the present invention is not limited to MISFETs, but may be other types of semiconductor devices such as insulated gate bipolar transistors (IGBTs), for example. An IGBT may have a similar configuration as that of the semiconductor device 300 shown in FIG. 17. However, a substrate of the second conductivity type is used as the semiconductor substrate 101. The first impurity region 103 is an emitter or a collector region, the first ohmic electrode 122 is an emitter electrode or a collector electrode, and the second ohmic electrode 111 is a collector electrode or an emitter electrode.

(Method 1 for Manufacturing Semiconductor Device of Third Embodiment)

Next, referring to FIGS. 18 to 29, Method 1 for manufacturing a semiconductor device of the present embodiment will be described. FIGS. 18 to 29 are schematic step-by-step cross-sectional views illustrating the manufacturing method of the present embodiment.

First, an n-type 4H—SiC (0001) substrate is prepared as the semiconductor substrate 101. This substrate is offcut by 8° or 4° in the <11-20> direction, for example, and the n-type impurity concentration is $1 \times 10^{18}$ cm$^{-3}$ to $5 \times 10^{19}$ cm$^{-3}$.

Figure 18:
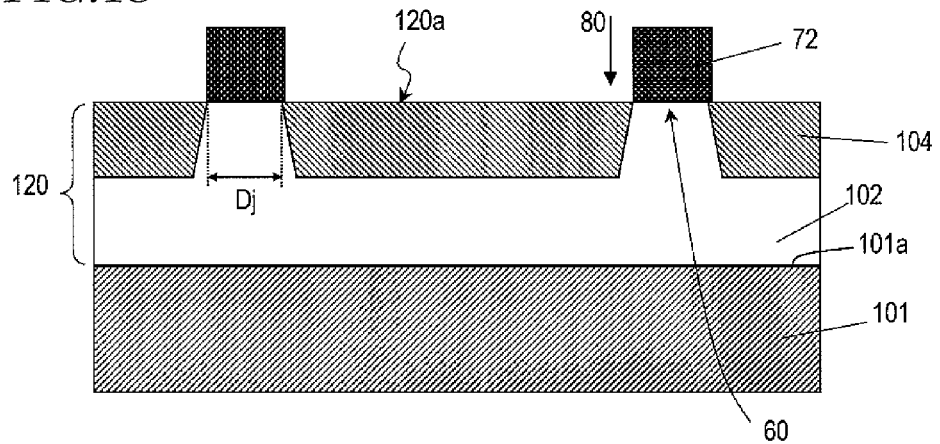
FIG. 18 is a step-by-step cross-sectional view illustrating Method 1 for manufacturing a semiconductor device of the third embodiment.

Then, as shown in FIG. 18, the first silicon carbide layer 120 is formed by epitaxial growth on the principal surface 101a of the semiconductor substrate 101. For example, the first silicon carbide layer 120 is epitaxially grown by a thermal CVD method, using silane (SiH$_4$) and propane (C$_3$H$_8$) as material gases, hydrogen (H$_2$) as a carrier gas, and a nitrogen (N$_2$) gas as a dopant gas. The thickness of the first silicon carbide layer 120 is 10 µm or more, and the impurity concentration is $1 \times 10^{15}$ cm$^{-3}$ to $1 \times 10^{16}$ cm$^{-3}$.

Next, an implantation mask material is deposited (not shown) on the upper surface 120a of the first silicon carbide layer 120, and a photoresist (not shown) is formed on the implantation mask material. The implantation mask material is SiO$_2$ (silicon oxide), for example. The implantation mask material formed by silicon oxide is deposited by a plasma CVD method with a power of 200 W using silane (SiH$_4$) and N$_2$O gases, for example. The thickness of the implantation mask material is 0.5-1.0 μm, for example. The photoresist (not shown) is positioned and sized so as to define the body region 104 and the JFET region 60. For example, the photoresist is a photosensitive organic film, and is formed by using a typical photolithography method. The thickness of the photoresist is 1.5-2.0 μm, for example. The implantation mask material is etched using the photoresist as a mask to form the first implantation mask 72, and the photoresist is removed thereafter. The etching of the implantation mask material is performed by an anisotropic dry etching method using a CF$_4$ gas and a CHF$_3$ gas, for example. The photoresist is removed by ashing with an oxygen plasma, for example. Hereinafter, implantation masks for ion implantation are formed by similar methods unless otherwise specified.

Then, Al$^+$, for example, as the impurity 80 of the second conductivity type, is implanted into the first silicon carbide layer 120 using the first implantation mask 72 as a mask, thereby forming the body region 104 having a predetermined depth in the vicinity of the upper surface 120a of the first silicon carbide layer 120. For example, the ion implantation is performed in a plurality of iterations with different levels of energy in the range of 30 keV to 350 keV while keeping the substrate temperature at 500° C. The depth of the body region 104 is 0.5 μm to 1.0 μm, for example. The region in the vicinity of the upper surface 120a of the first silicon carbide layer 120, which is defined by being sandwiched between the body regions 104, serves as the JFET region 60. The width Dj of the JFET region 60 of the present embodiment is 3 μm, for example. The remaining region of the first silicon carbide layer 120, in which the body regions 104 are not formed, serves as the drift region 102.

Figure 19:
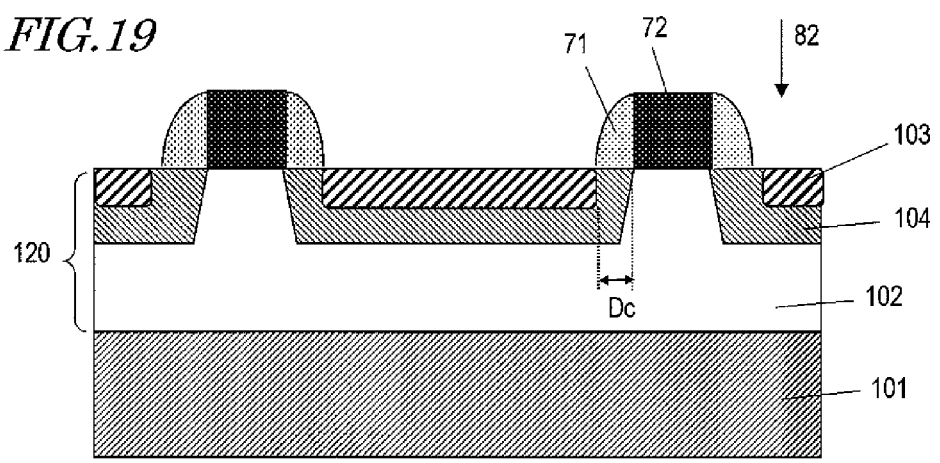
FIG. 19 is a step-by-step cross-sectional view illustrating Method 1 for manufacturing a semiconductor device of the third embodiment.

Next, as shown in FIG. 19, an implantation mask material is deposited on the upper surface 120a of the first silicon carbide layer 120 so as to cover the first implantation mask 72. The implantation mask material is poly-Si (polysilicon), for example, and is formed by a thermal CVD method. SiH$_4$ is used, for example, as the material gas. The implantation mask material is etched by anisotropic etching, thereby forming the first sidewall 71 on the side wall of the first implantation mask 72. The first sidewall 71 defines the length (width) Dc of the channel. The gas used in anisotropic etching is a mixed gas of Cl$_2$, O2, HBr, etc., for example.

Next, N$^+$ (nitrogen ion) or (phosphorus ion) is implanted as the impurity 82 of the first conductivity type into the upper surface 120a of the first silicon carbide layer 120, using the first implantation mask 72 and the first sidewall 71 as a mask, thereby forming the first impurity region 103. The ion implantation is performed in a plurality of iterations with different levels of energy in the range of 30 keV to 90 keV while keeping the temperature of the semiconductor substrate 101 at 500° C. The depth of the first impurity region 103 is 0.25 μm, for example.

Then, the first implantation mask 72 and the first sidewall 71 are removed. The first implantation mask 72 is removed with an HF aqueous solution as it is formed by silicon oxide, for example, and the first sidewall 71 is removed with a mixed solution of HF, HNO$_3$ and H$_2$O as it is formed by a polysilicon.

Figure 20:
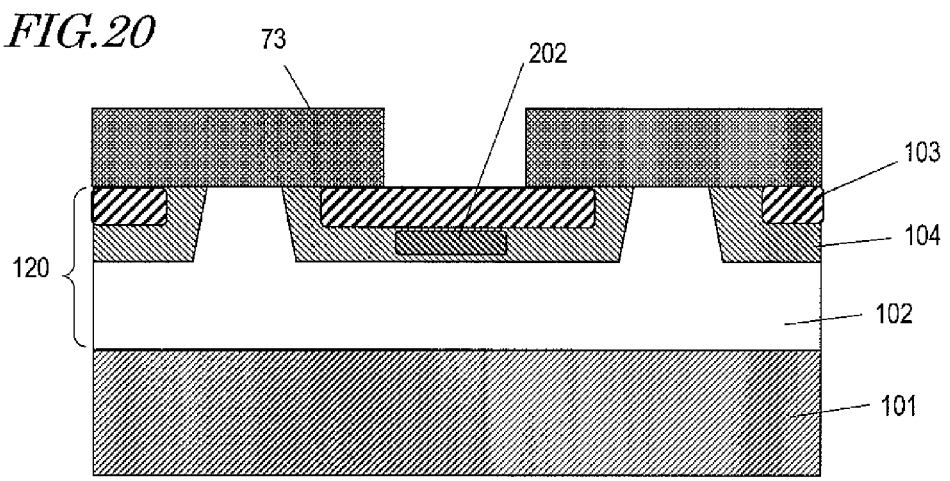
FIG. 20 is a step-by-step cross-sectional view illustrating Method 1 for manufacturing a semiconductor device of the third embodiment.

Thereafter, as shown in FIG. 20, the third implantation mask 73 is formed on the upper surface 120a of the first silicon carbide layer 120. An Al ion, for example, is implanted at 280 keV using the third implantation mask 73, thereby forming the contact region 202 under the first impurity region 103 and inside the body region 104.

After the third implantation mask 73 is removed, annealing (activation annealing) for activating the impurity ion implanted into the first silicon carbide layer 120 is performed, though it is not shown in the figures. The activation annealing is performed in an Ar atmosphere, at a temperature of 1700° C. for 30 minutes, for example.

Figure 21:
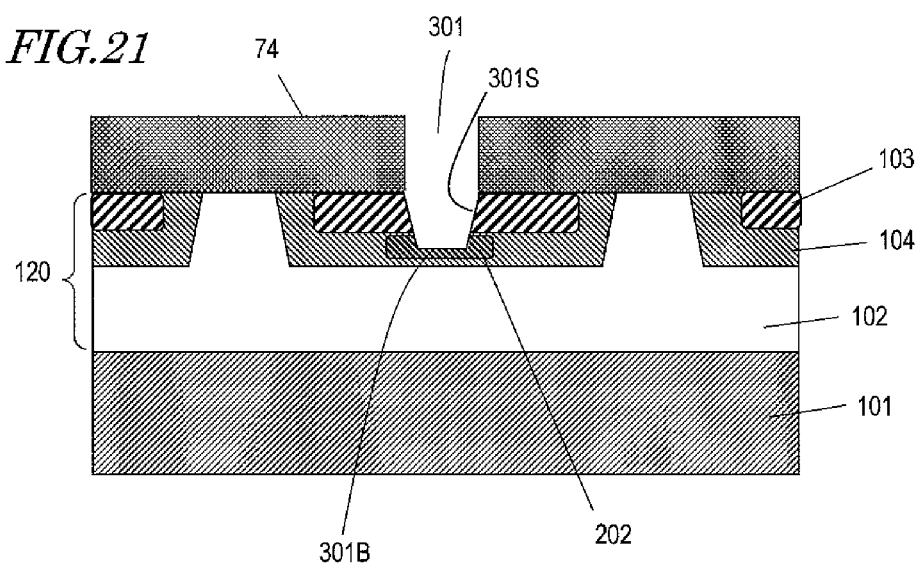
FIG. 21 is a step-by-step cross-sectional view illustrating Method 1 for manufacturing a semiconductor device of the third embodiment.

Next, as shown in FIG. 21, a trench etching mask 74 is formed, and the first silicon carbide layer 120 is dry-etched using this as a mask, thereby forming the contact trench 301 for a body contact. A mixed gas of Cl$_2$, HBr and O$_2$, for example, is used in this etching.

Preferably, so-called "tapered etching" is performed such that the area of the opening of the contact trench 301 is greater than the area of the bottom surface. Then, the side wall 301S of the contact trench 301 is non-vertical with respect to the upper surface 120a of the first silicon carbide layer 120, allowing for an increase in the area of the side wall 301S. Therefore, it is possible to increase the contact area between the first ohmic electrode to be later formed in the contact trench 301 and the first impurity region 103 and the contact region 202, and it is therefore possible to reduce the contact resistance therebetween.

In order to perform tapered etching, for example, etching is performed at a pressure of 1.5 Pa while introducing Cl$_2$, HBr and O$_2$ at flow rates of 70 sccm, 50 sccm and 2 sccm, respectively, and applying an ICP bias of 600 W and a DC bias of 150 W.

It is preferred that the bottom surface 301B of the contact trench 301 is deeper than the bottom surface of the first impurity region 103 and the upper surface of the contact region 202 and shallower than the bottom surface of the contact region 202. The depth of the contact trench 301 (the depth from (the upper surface 120a of the first silicon carbide layer 120 to the bottom surface 301B of the contact trench 301) is 0.4 μm, for example.

In this example, the trench etching mask 74 is designed so that the opening thereof is located over the contact region 202 and the width of the opening is smaller than the width of the contact region 202. Therefore, the width of the opening of the contact trench 301 and the width of the bottom surface 301B are both smaller than the width of the contact region 202.

Figure 22:
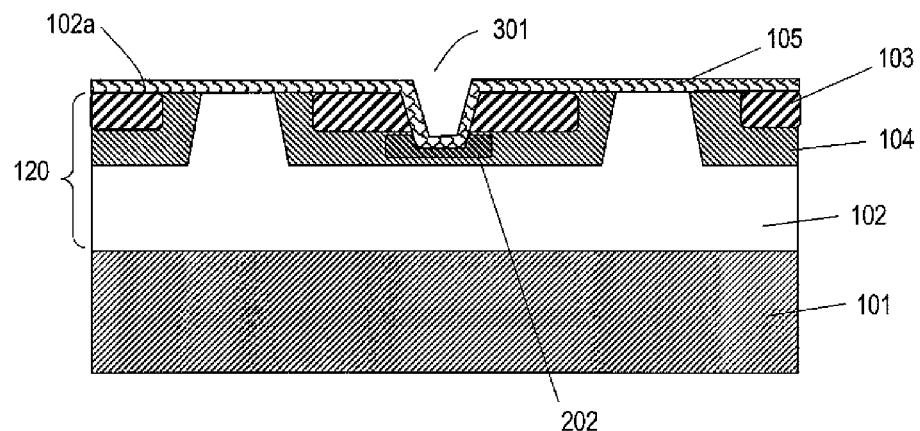
FIG. 22 is a step-by-step cross-sectional view illustrating Method 1 for manufacturing a semiconductor device of the third embodiment.

Next, as shown in FIG. 22, the second silicon carbide layer 105 is formed on the upper surface 120a of the first silicon carbide layer 120 and in the contact trench 301. The second silicon carbide layer 105 in the present embodiment is formed by SiC. For example, the second silicon carbide layer 105 is formed by a thermal CVD method using silane (SiH$_4$) and propane (C$_3$H$_8$) as material gases, hydrogen (H$_2$) as a carrier gas, and a nitrogen (N$_2$) gas as a dopant gas. The conductivity type of the second silicon carbide layer 105 is the first conductivity type, and the impurity concentration thereof is $1 \times 10^{18}$ cm$^{-3}$ to $5 \times 10^{18}$ cm$^{-3}$. The thickness of the second silicon carbide layer 105 is 30 nm to 150 nm. A nitrogen (N$_2$) gas may be introduced during the growth of the second silicon carbide layer 105 so that a portion of the second silicon carbide layer 105 has a higher concentration.

Figure 23:
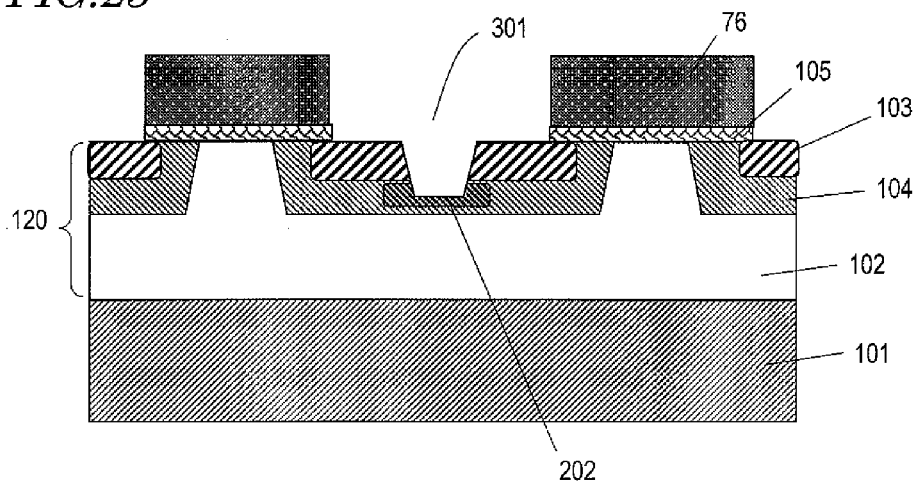
FIG. 23 is a step-by-step cross-sectional view illustrating Method 1 for manufacturing a semiconductor device of the third embodiment.

Next, as shown in FIG. 23, the photoresist 76 is formed on the second silicon carbide layer 105, and then the second silicon carbide layer 105 is etched using the photoresist 76 as a mask. The etching of the second silicon carbide layer 105 is performed by dry etching using a mixed gas of CF$_4$ and O$_2$, for example.

Figure 24:
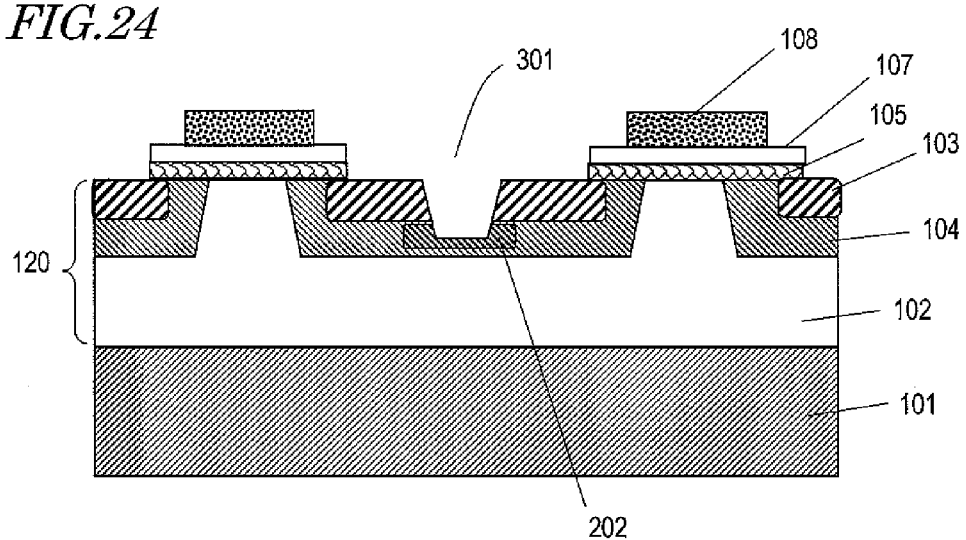
FIG. 24 is a step-by-step cross-sectional view illustrating Method 1 for manufacturing a semiconductor device of the third embodiment.

Next, as shown in FIG. 24, after the photoresist 76 is removed, the gate insulating film (SiO$_2$) 107 is formed on the second silicon carbide layer 105, and then the gate electrode (poly-Si) 108 is formed on the gate insulating film 107. Then, a photoresist (not shown) is formed on the gate electrode 108, the gate electrode 108 is etched, and the photoresist is removed. The gate insulating film 107 and the gate electrode 108 may be patterned simultaneously using the same photoresist. In such a case, the end portion of the gate insulating film 107 and the end portion of the gate electrode 108 are generally aligned with each other (not shown) as seen from the direction vertical to the principal surface 101a of the semiconductor substrate 101.

Figure 25:
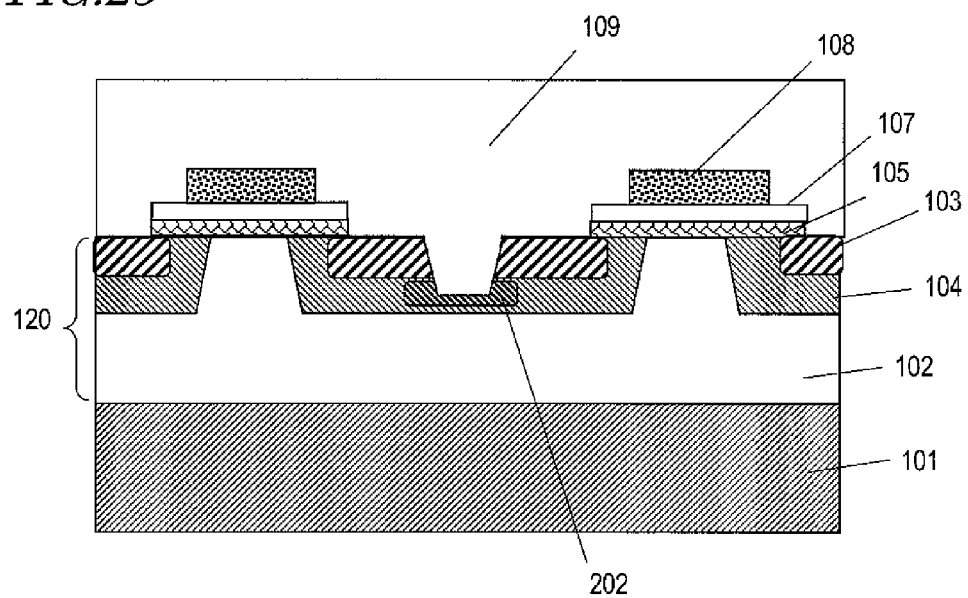
FIG. 25 is a step-by-step cross-sectional view illustrating Method 1 for manufacturing a semiconductor device of the third embodiment.

Next, as shown in FIG. 25, the interlayer insulating film 109 is formed on the first silicon carbide layer 120 so as to cover the gate electrode 108 and the second silicon carbide layer 105. The interlayer insulating film 109 is formed by silicon oxide ($SiO_2$), for example, and the thickness thereof is 1000 nm, for example.

Figure 26:
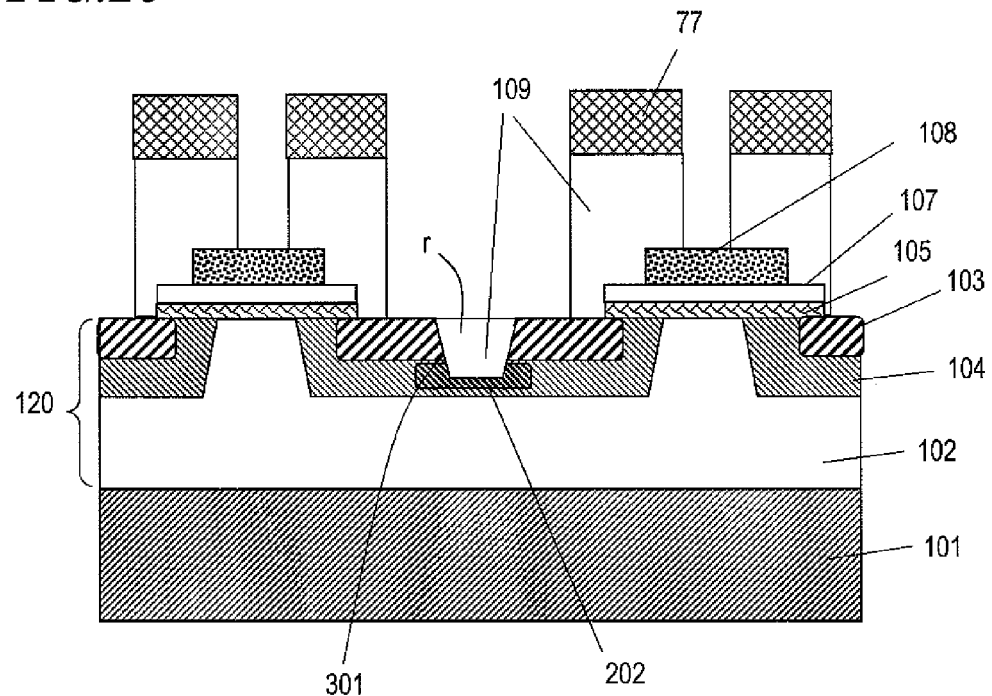
FIG. 26 is a step-by-step cross-sectional view illustrating Method 1 for manufacturing a semiconductor device of the third embodiment.

Next, as shown in FIG. 26, the interlayer insulating film 109 is etched using the photoresist 77 as a mask. The etching of the interlayer insulating film 109 is performed by dry etching using a mixed gas of $CHF_3$ and $O_2$, for example. Note however that with only the dry etching using a mixed gas of $CHF_3$ and $O_2$, it is difficult to etch as far as a portion r of the interlayer insulating film 109 that is located in the contact trench 301.

Figure 27:
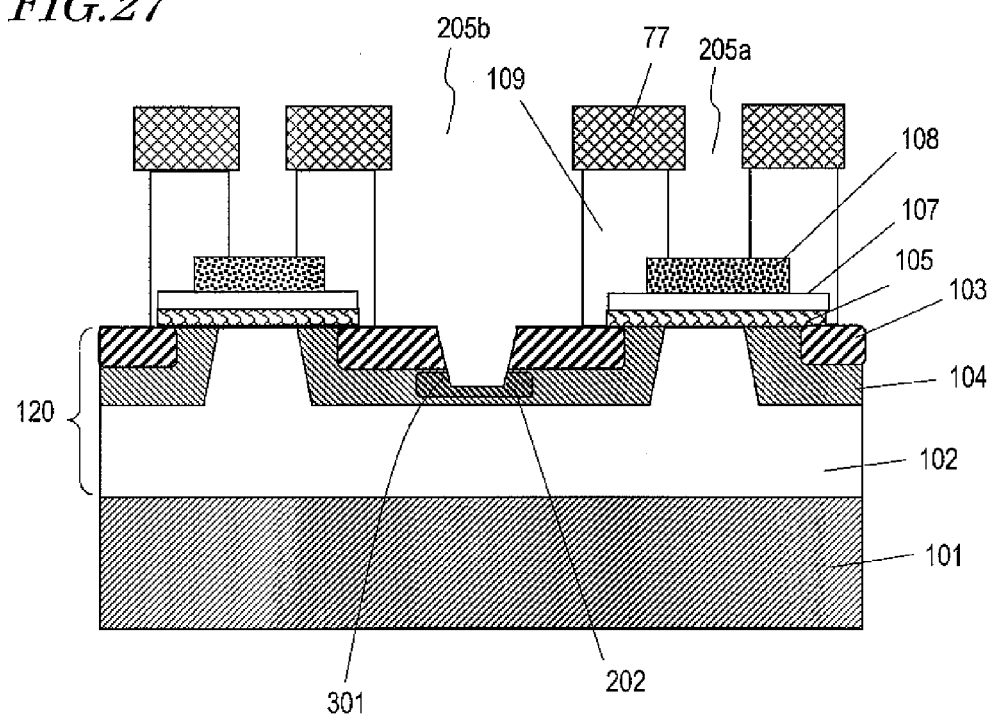
FIG. 27 is a step-by-step cross-sectional view illustrating Method 1 for manufacturing a semiconductor device of the third embodiment.

Therefore, as shown in FIG. 27, in order to remove the portion r located in the contact trench 301, wet etching using BHF, or the like, for example, or isotropic etching using a $CF_4$ gas, or the like, is also performed. Thus, there are formed the contact hole 109a, through which the gate electrode 108 is exposed, and the contact hole 109b, through which the bottom surface and the side surface of the contact trench 301 are exposed.

Figure 28:
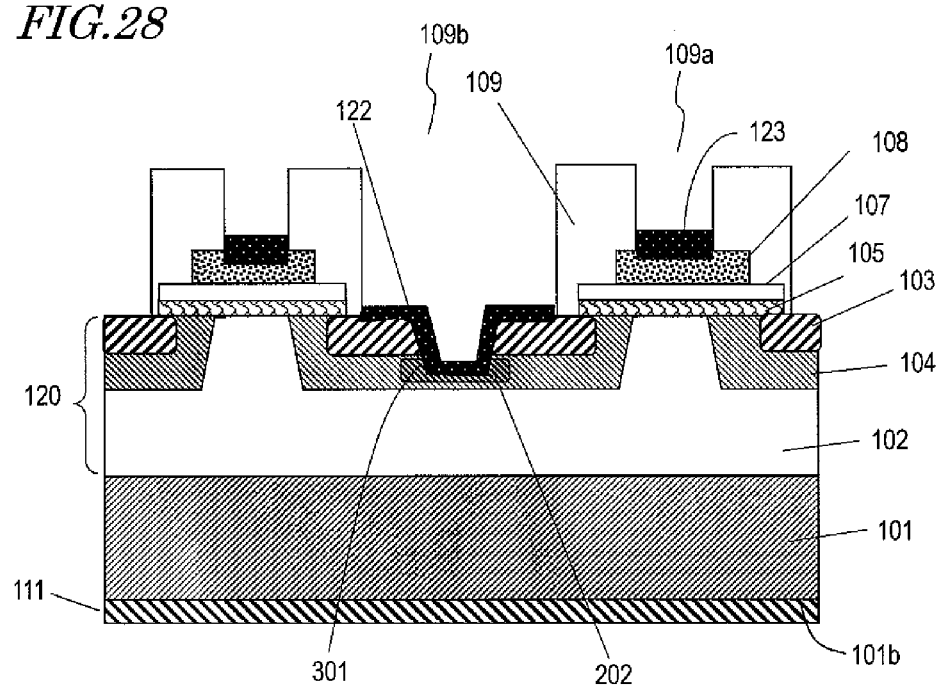
FIG. 28 is a step-by-step cross-sectional view illustrating Method 1 for manufacturing a semiconductor device of the third embodiment.

Next, as shown in FIG. 28, after the photoresist 77 is removed, a contact metal (titanium (Ti) or nickel (Ni)) is deposited in the contact hole 109a and the contact hole 109b, and a heat treatment is performed, thereby allowing the contact metal to react (silicify) with silicon carbide or polysilicon. Where Ti is deposited as the contact metal, the silicification can be done by performing a heat treatment at a temperature of 950° C., for example, after the deposition of Ti.

Then, an unsilicified portion (unreacted portion) of the contact metal is removed. Thus, in the contact trench 301, the first ohmic electrode 122 is formed, which is formed by a metal silicide and is in contact with the first impurity region 103 and the contact region 202. The metal silicide layer 123 is also formed on the gate electrode 108 in the contact hole 109a. Thus, in the present embodiment, in the contact trench 301, the contact region 202 and a portion of the first impurity region 103 are alloyed with the contact metal to be the first ohmic electrode 122.

A metal is deposited on the reverse surface 101b of the semiconductor substrate 101 and a heat treatment is performed, thereby forming the second ohmic electrode 111. It is formed by, for example, performing a heat treatment at 950° C. after depositing Ti.

Figure 29:
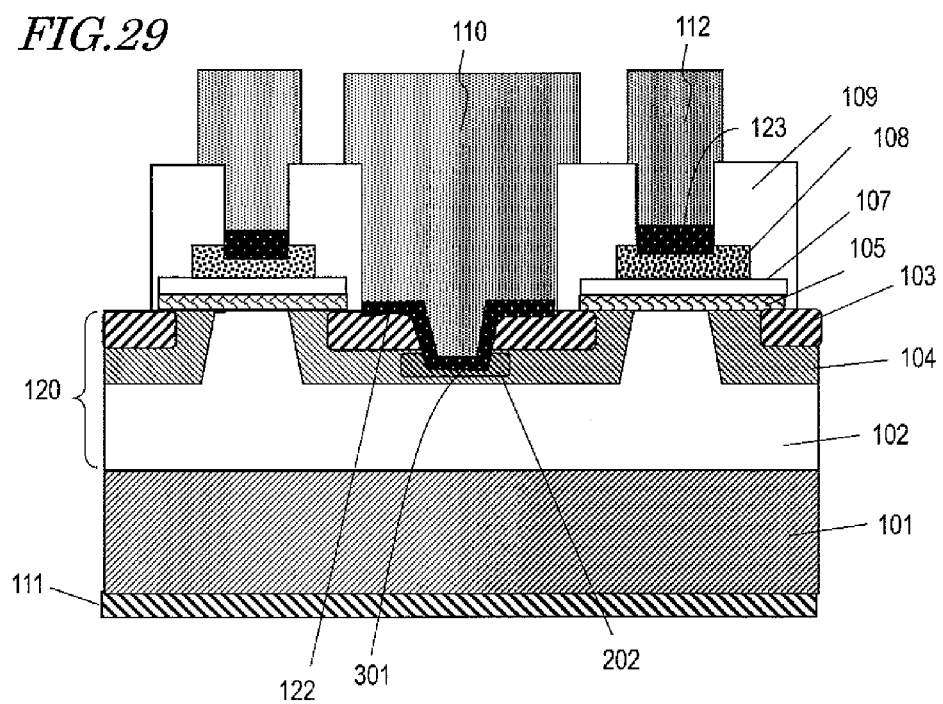
FIG. 29 is a step-by-step cross-sectional view illustrating Method 1 for manufacturing a semiconductor device of the third embodiment.

Lastly, as shown in FIG. 29, the interconnects 112 and 110 are formed in the contact holes 109a and 109b, respectively, so as to be in contact with the first ohmic electrode 122 and the metal silicide layer 123. Thus, the semiconductor device 300 is completed.

With Manufacturing Method 1 described above, it is only necessary to form the contact region 202 of a desired thickness under the first impurity region 103, and the contact region 202 does not need to be formed across the thickness of the first impurity region 103 as in the conventional semiconductor device 1000 (FIG. 37). Therefore, the thickness of the contact region 202 can be made smaller than that of the conventional technique, and it is therefore possible to reduce the number of iterations of ion implantation for the formation of the contact region 202. Thus, it is possible to shorten the amount of time required for the manufacture and reduce the manufacturing cost as compared with the conventional manufacturing method. Since the first ohmic electrode 122 can be brought into contact with the contact region 202 not only on the bottom surface 301B of the contact trench 301 but also on a portion of the side wall 301S, it is possible to ensure the contact area between the first ohmic electrode 122 and the contact region 202 while suppressing the increase in the chip area. As a result, it is possible to reduce the contact resistance between the first ohmic electrode 122 and the body region 104, and thus to suppress the switching delay.

According to the method described above, the contact trench 301 is formed after the impurity implantation steps for the first silicon carbide layer 120 are all performed. Therefore, before the formation of the contact trench 301, activation annealing for activating the impurities implanted into the first silicon carbide layer 120 can be performed. A study by the present inventors has revealed that if activation annealing is performed after the formation of the contact trench 301, silicon carbide exposed by the contact trench 301 sublimates during the activation annealing, whereby the silicon carbide layer surface disappears. As a result, the contact region 202 may become thin, for example. If the contact region 202 becomes thin, the contact region 202 may entirely react (silicifies) with the contact metal in the first ohmic electrode formation step, thereby failing to sufficiently reduce the contact resistance between the first ohmic electrode 122 and the body region 104. In order to avoid this, it is necessary to form the contact region 202 to be thick in advance. In contrast, if activation annealing is performed before the formation of the contact trench 301, it is not necessary to form the contact region 202 to be thick in advance taking into consideration the sublimation of silicon carbide, and it is therefore possible to further downsize the semiconductor device 300.

(Method 2 for Manufacturing Semiconductor Device of Third Embodiment)

Figure 30:
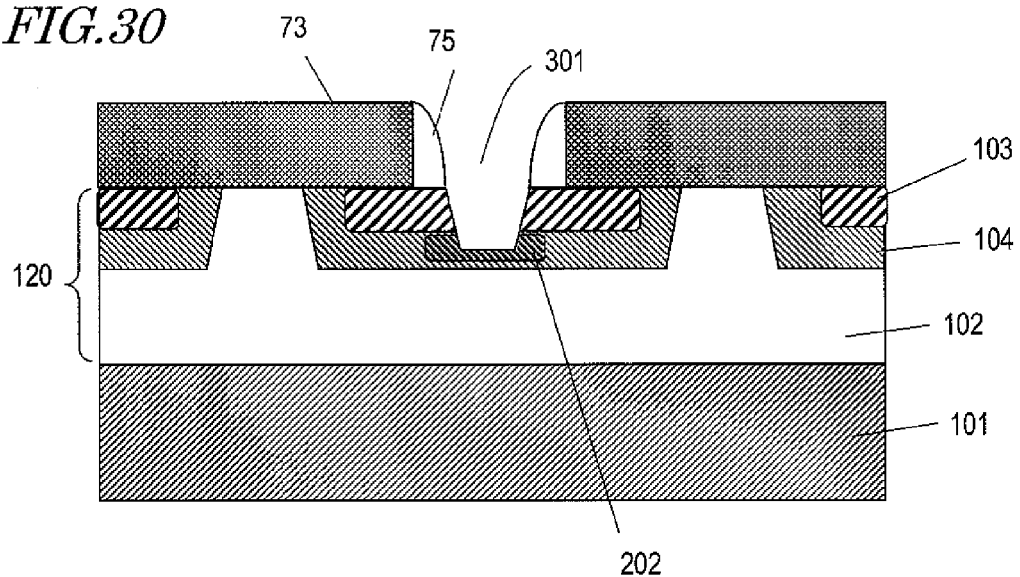
FIG. 30 is a step-by-step cross-sectional view illustrating Method 2 for manufacturing a semiconductor device of the third embodiment.

Next, Method 2 for manufacturing a semiconductor device of the present embodiment will be described. FIG. 30 is a schematic step-by-step cross-sectional view illustrating Manufacturing Method 2 of the present embodiment.

First, steps for implanting impurities into the first silicon carbide layer 120 are performed in similar steps to those of Manufacturing Method 1 described above with reference to FIGS. 18 to 20.

Then, as shown in FIG. 30, a mask material, e.g., a silicon oxide film, (not shown) is formed by a CVD method so as to cover the third implantation mask 73 used in the formation of the contact region 202. Thereafter, anisotropic etching is performed. Thus, a second sidewall 75 formed by a silicon oxide film is obtained on the side surface of the third implantation mask 73. Then, the contact trench 301 is formed using the third implantation mask 73 and the second sidewall 75 as an etching mask.

After the formation of the contact trench 301, the third implantation mask 73 and the second sidewall 75 are removed. Then, activation annealing for activating the impurity ions implanted into the first silicon carbide layer 120 is performed. As described above, in this method, activation annealing is performed after the formation of the contact trench 301.

The subsequent steps are similar to those of Manufacturing Method 1 described above with reference to FIGS. 22 to 29, and will not be further described below.

Also in Manufacturing Method 2, as in Manufacturing Method 1, it is possible to reduce the number of iterations of ion implantation for the formation of the contact region 202 as compared with the conventional technique. It is also possible to ensure the contact area between the first ohmic electrode 122 and the contact region 202 while suppressing the increase in the chip area.

Moreover, with Manufacturing Method 2, since the second sidewall 75 is formed, and the contact trench 301 is formed using this as an etching mask, the contact trench 301 can be formed in a self-aligned manner with respect to the contact region 202. Therefore, it is no longer necessary to take into consideration the lithography misalignment, and it is possible to reduce the opening area of the third implantation mask 73 and to further downsize the semiconductor device 300.

(Method 3 for Manufacturing Semiconductor Device of Third Embodiment)

Figure 31:
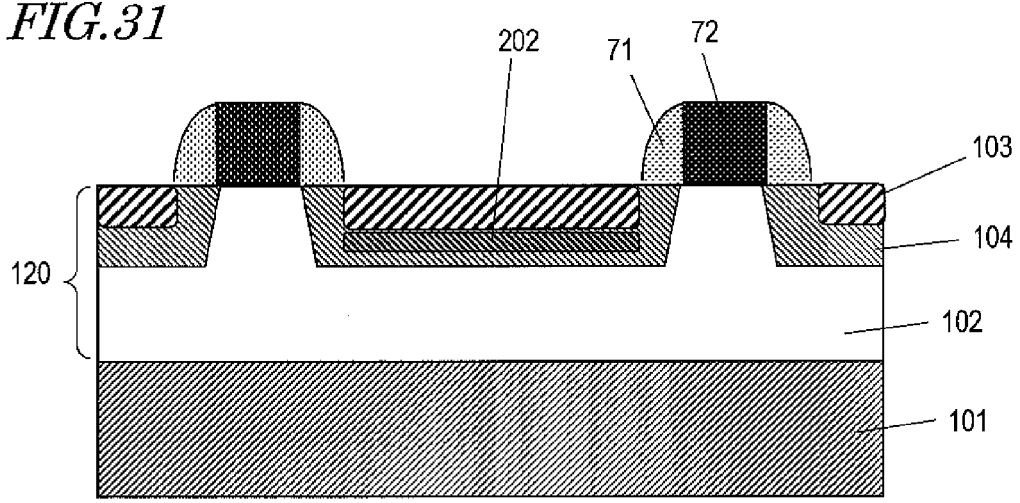
FIG. 31 is a step-by-step cross-sectional view illustrating Method 3 for manufacturing a semiconductor device of the third embodiment.

Next, Method 3 for manufacturing a semiconductor device of the present embodiment will be described. FIG. 31 is a schematic step-by-step cross-sectional view illustrating Manufacturing Method 3 of the present embodiment.

First, the body region 104 and the first impurity region 103 are formed in the first silicon carbide layer 120 in steps similar to those of Manufacturing Method 1 described above with reference to FIGS. 18 and 19.

Then, as shown in FIG. 31, an impurity of the second conductivity type is implanted into the body region 104 using the implantation mask (herein, the first implantation mask 72 and the first sidewall 71) used in the formation of the first impurity region 103. Thus, the contact region 202 is formed under the first impurity region 103. With this method, the contact region 202 is formed having a contour that is generally aligned with the contour of the first impurity region 103 as seen from the direction vertical to the principal surface 101a of the semiconductor substrate 101.

After the formation of the contact region 202, the first implantation mask 72 and the first sidewall 71 are removed. Then, activation annealing for activating the impurity ions implanted into the first silicon carbide layer 120 is performed.

The subsequent steps are similar to those of Manufacturing Method 1 described above with reference to FIGS. 21 to 29, and will not be further described below.

While the first impurity region 103 is formed first after the formation of the first implantation mask 72 and the first sidewall 71 herein, the contact region 202 may be formed first in the first silicon carbide layer 120 and then the first impurity region 103 may be formed.

Also in Manufacturing Method 3, as in Manufacturing Method 1, it is possible to reduce the number of iterations of ion implantation for the formation of the contact region 202 as compared with the conventional technique. It is also possible to ensure the contact area between the first ohmic electrode 122 and the contact region 202 while suppressing the increase in the chip area.

Moreover, with Manufacturing Method 3, since it is not necessary to form, by photolithography, an implantation mask for the formation of the contact region 202, it is possible to further simplify the manufacturing steps. The contact region 202 can be formed in a self-aligned manner with respect to the body region 104. Moreover, as described in Manufacturing Method 1, since activation annealing is performed before the formation of the contact trench 301, it is not necessary to take into consideration the sublimation of silicon carbide during the activation annealing, thereby more effectively realizing a reduction in size.

(Method 4 for Manufacturing Semiconductor Device of Third Embodiment)

Figure 32:
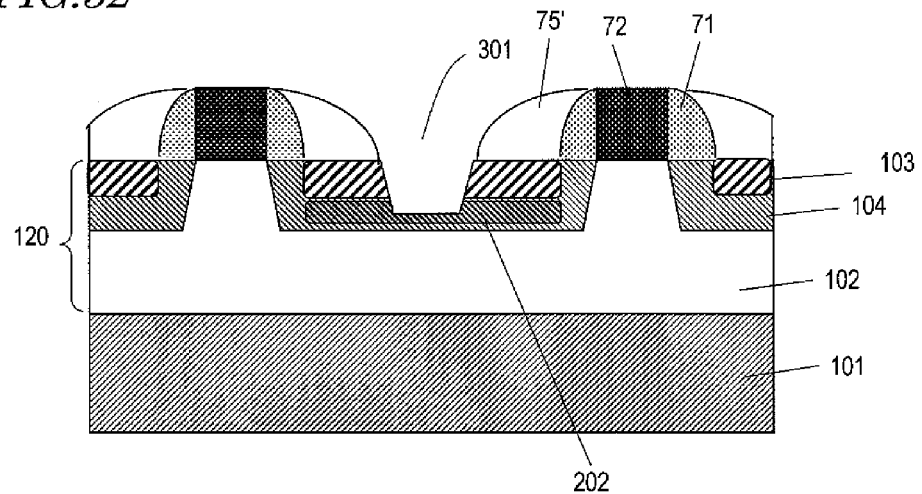
FIG. 32 is a step-by-step cross-sectional view illustrating Method 4 for manufacturing a semiconductor device of the third embodiment.

Next, Method 4 for manufacturing a semiconductor device of the present embodiment will be described. FIG. 32 is a schematic step-by-step cross-sectional view illustrating Manufacturing Method 4 of the present embodiment.

An impurity implantation step for forming the contact region 202 in the first silicon carbide layer 120 is performed using the implantation mask used in the formation of the first impurity region 103, by a method similar to that of Manufacturing Method 3 described above with reference to FIG. 31.

Then, as shown in FIG. 32, a mask material, e.g., a silicon oxide film, (not shown) is formed by a CVD method so as to cover the implantation mask (herein, the first implantation mask 72 and the first sidewall 71) used in the formation of the contact region 202. Thereafter, anisotropic etching is performed. Thus, a second sidewall 75' formed by a silicon oxide film is obtained on the side surface of the first sidewall 71. Then, the contact trench 301 is formed using the first implantation mask 72, the first sidewall 71 and the second sidewall 75' as an etching mask.

After the formation of the contact trench 301, the first implantation mask 72, the first sidewall 71 and the second sidewall 75' are removed. Then, activation annealing for activating the impurity ions implanted into the first silicon carbide layer 120 is performed. As described above, in this method, activation annealing is performed after the formation of the contact trench 301.

The subsequent steps are similar to those of Manufacturing Method 1 described above with reference to FIGS. 22 to 29, and will not be further described below.

Also in Manufacturing Method 4, as in Manufacturing Method 1, it is possible to reduce the number of iterations of ion implantation for the formation of the contact region 202 as compared with the conventional technique. It is also possible to ensure the contact area between the first ohmic electrode 122 and the contact region 202 while suppressing the increase in the chip area.

Moreover, according to Manufacturing Method 4, the contact trench 301, the contact region 202 and the first impurity region 103 can all be formed in a self-aligned manner with respect to the body region 104. Therefore, it is no longer necessary to take into consideration the lithography misalignment, and it is possible to more effectively downsize the semiconductor device 300.

The manufacturing method of the present embodiment is not limited to the method described above, and there may be various modifications thereto. For example, while an implantation mask for the formation of the first impurity region 103 is provided by forming the first sidewall 71 in the first implantation mask 72 for the formation of the body region 104 in Manufacturing Methods 1-4, an implantation mask for the formation of the first impurity region 103 may be formed by photolithography separately from the first implantation mask 72.

While the semiconductor devices of the first to third embodiments described above are MISFETs having the planar structure, they may be MISFETs having the gate trench structure.

Figure 33:
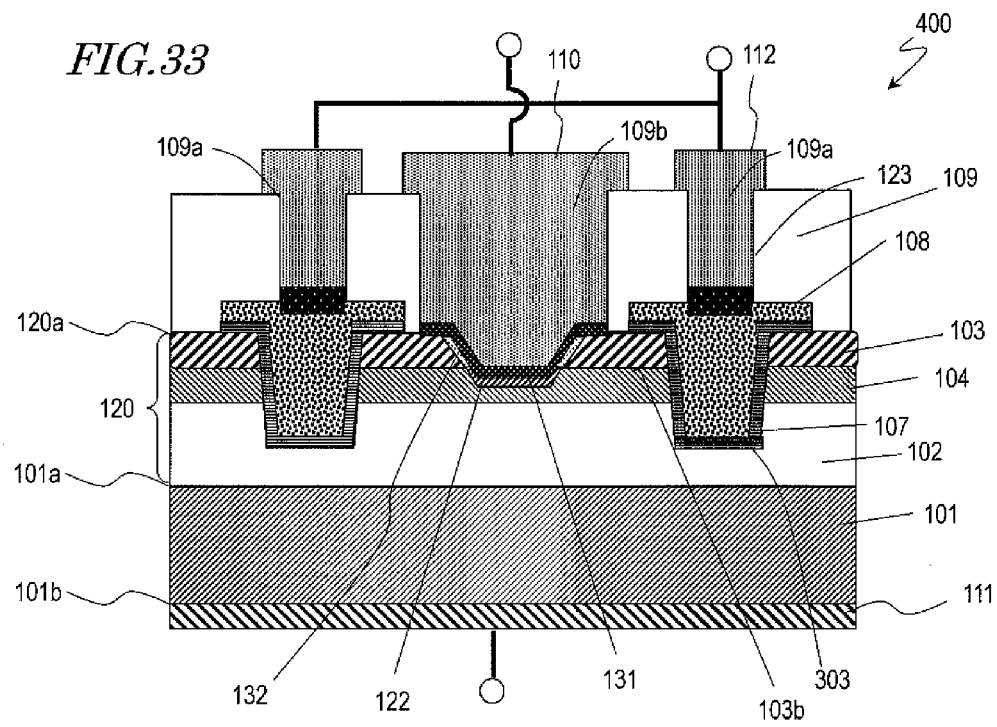
FIG. 33 is a schematic cross-sectional view of another semiconductor device according to the first embodiment of the present invention.
Figure 34:
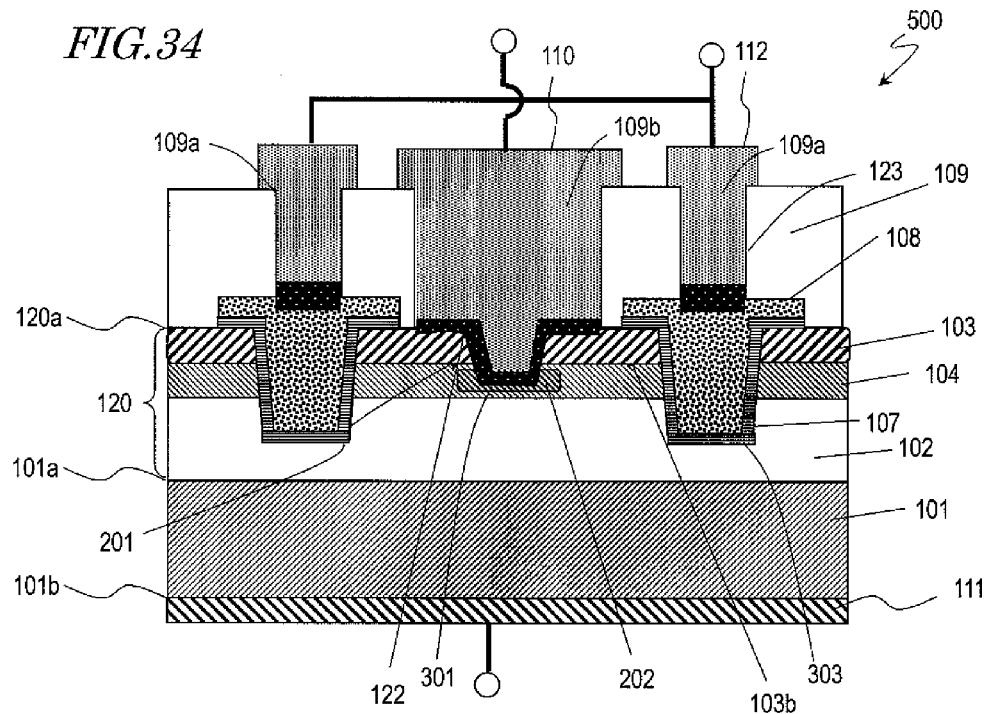
FIG. 34 is a schematic cross-sectional view of another semiconductor device according to the third embodiment of the present invention.

FIGS. 33 and 34 are schematic cross-sectional views illustrating other semiconductor devices of the first to third embodiments. Semiconductor devices 400 and 500 shown in FIGS. 33 and 34 are both an inversion channel-type MISFET having the gate trench structure. For the sake of simplicity, like elements to those of FIGS. 1 and 17 are denoted by the same reference numerals and will not be further described below.

The semiconductor device 400 shown in FIG. 33 has a similar contact trench structure to the semiconductor device 100 shown in FIG. 1. The semiconductor device 500 shown in FIG. 34 has a similar contact trench structure to the semiconductor device 300 shown in FIG. 17.

In these semiconductor devices 400 and 500, the first impurity region 103 is arranged in the surface region of the first silicon carbide layer 120, and the body region 104 is formed under the first impurity region 103 in contact with the first impurity region 103. The contact region 202 is located in the body region 104, and is electrically connected to the body region 104. The drift region 102 is arranged between the body region 104 and the semiconductor substrate 101.

A gate trench 303, which penetrates through the first impurity region 103 and the body region 104 to reach the drift region 102, is formed in the first silicon carbide layer 120. The gate insulating film 107 is formed in the gate trench 303 so as to be in contact with the drift region 102, the body region 104 and the first impurity region 103. In the gate trench 303, the gate electrode 108 is provided on the gate insulating film 107. Otherwise, the configuration is similar to the configuration shown in FIG. 1 or FIG. 17.

The semiconductor devices 400 and 500 can be manufactured as follows, for example.

First, the first silicon carbide layer 120 is formed on the principal surface 101a of the semiconductor substrate 101. Then, an impurity is implanted into the first silicon carbide layer 120, thereby forming the first impurity region 103 of the first conductivity type and the body region 104 of the second conductivity type. Thereafter, an implantation mask is provided on the first silicon carbide layer 120, and an impurity of the second conductivity type is implanted into the body region 104 using the implantation mask, thereby forming the contact region 202. Then, the contact trench 301 and the gate trench 303 are formed in the first silicon carbide layer 120. Etching processes for forming these trenches 301 and 303 may be done simultaneously or separately.

Where etching processes for forming the contact trench 301 and the gate trench 303 are done separately when manufacturing the semiconductor device 500, an etching mask for the formation of the contact trench 301 may be formed by providing a sidewall in the mask used when forming the contact region 202, as in the method described above with reference to FIG. 30.

While the semiconductor devices 400 and 500 are of the inversion channel type, they may be of the accumulation channel type. When forming an accumulation channel MISFET, a second silicon carbide layer is formed between the side wall of the gate trench 303 and the gate insulating film 107 so as to be in contact with the first impurity region 103, the body region 104 and the drift region 102.

The semiconductor devices of the first to third embodiments may be MISFETs which have the planar structure and have a structure in which the second silicon carbide layer (channel layer) is arranged at a position different from that in the MISFETs shown in FIGS. 1 and 17.

Figure 35:
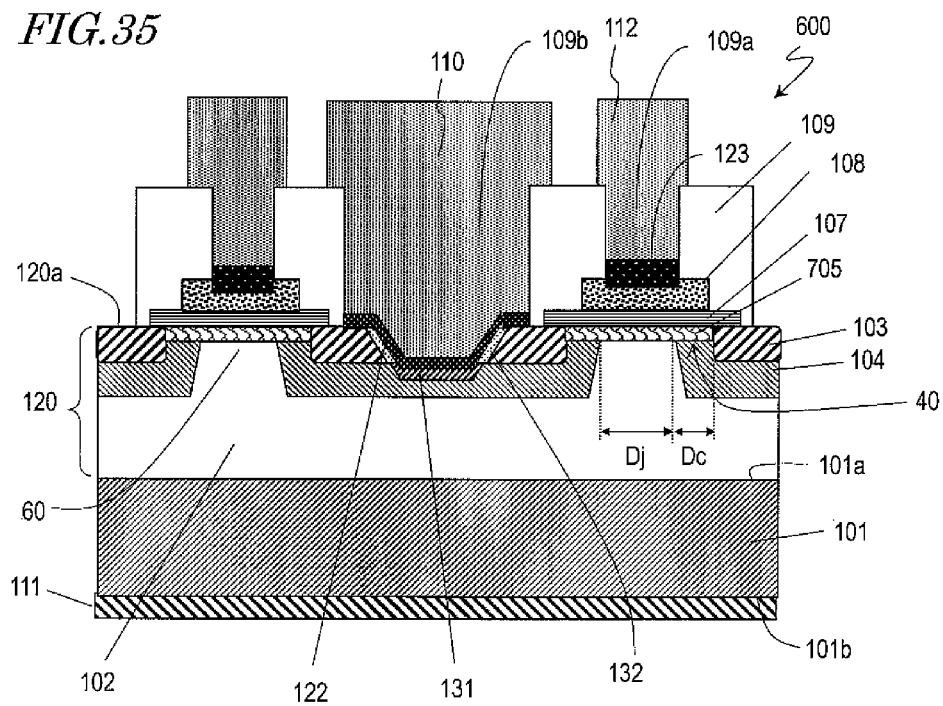
FIG. 35 is a schematic cross-sectional view of still another semiconductor device according to the first embodiment of the present invention.
Figure 38:
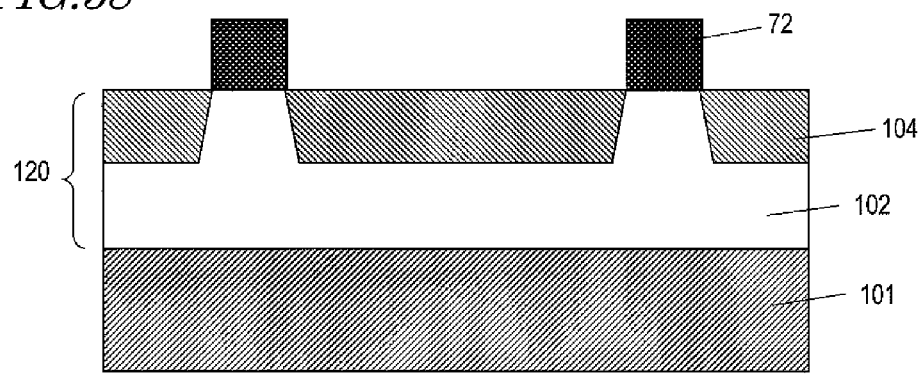
FIG. 38 is a step-by-step cross-sectional view illustrating a method for manufacturing the conventional semiconductor device shown in FIG. 37.
Figure 39:
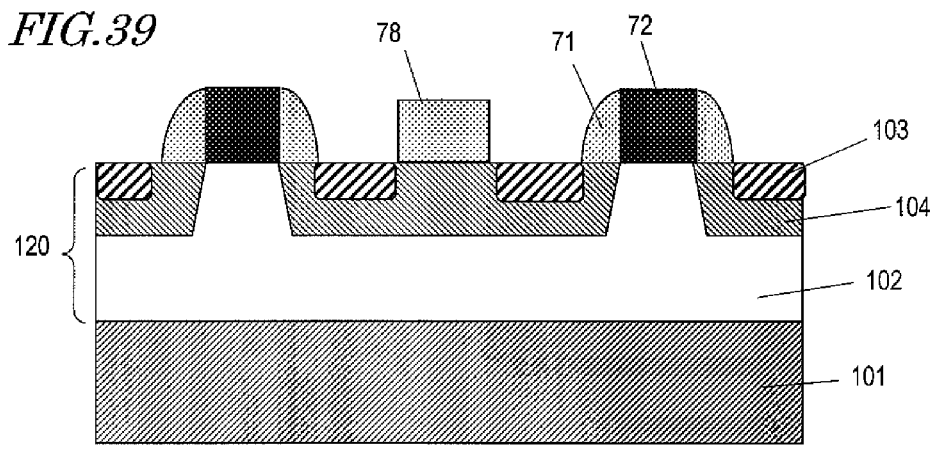
FIG. 39 is a step-by-step cross-sectional view illustrating the method for manufacturing the conventional semiconductor device shown in FIG. 37.
Figure 40:
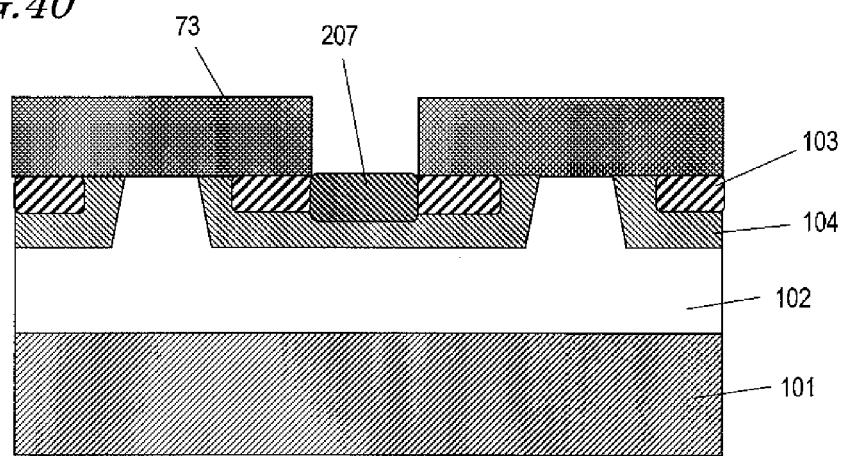
FIG. 40 is a step-by-step cross-sectional view illustrating the method for manufacturing the conventional semiconductor device shown in FIG. 37.
Figure 41:
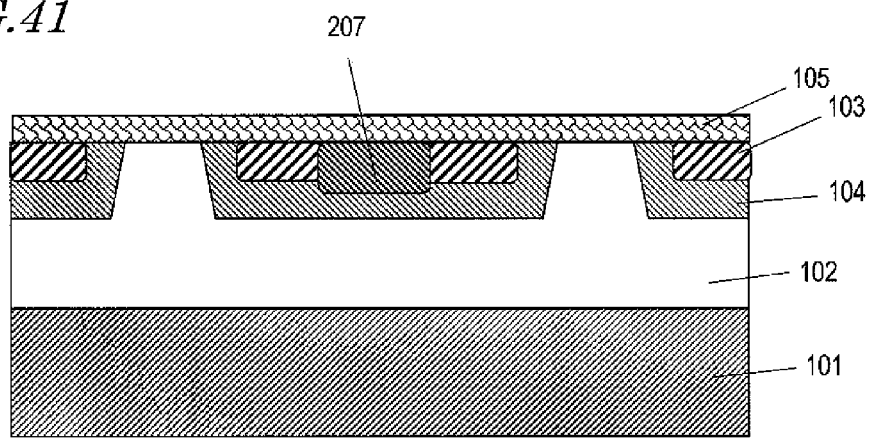
FIG. 41 is a step-by-step cross-sectional view illustrating the method for manufacturing the conventional semiconductor device shown in FIG. 37.
Figure 42:
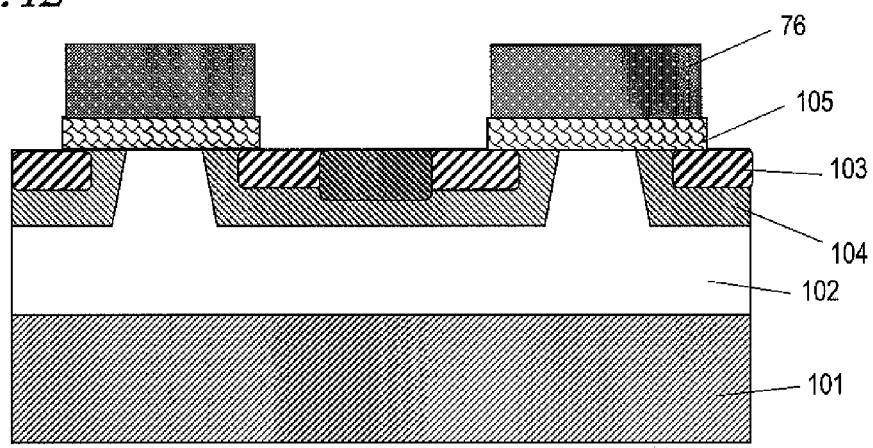
FIG. 42 is a step-by-step cross-sectional view illustrating the method for manufacturing the conventional semiconductor device shown in FIG. 37.
Figure 43:
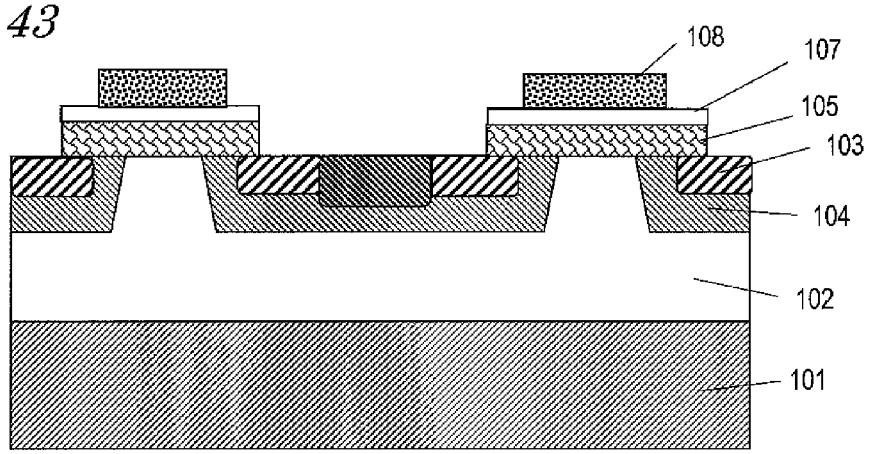
FIG. 43 is a step-by-step cross-sectional view illustrating the method for manufacturing the conventional semiconductor device shown in FIG. 37.
Figure 44:
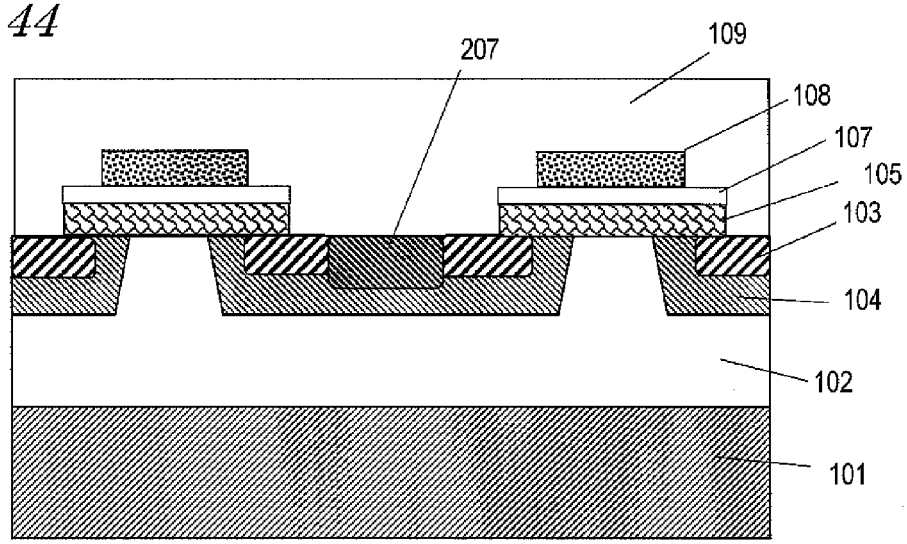
FIG. 44 is a step-by-step cross-sectional view illustrating the method for manufacturing the conventional semiconductor device shown in FIG. 37.
Figure 45:
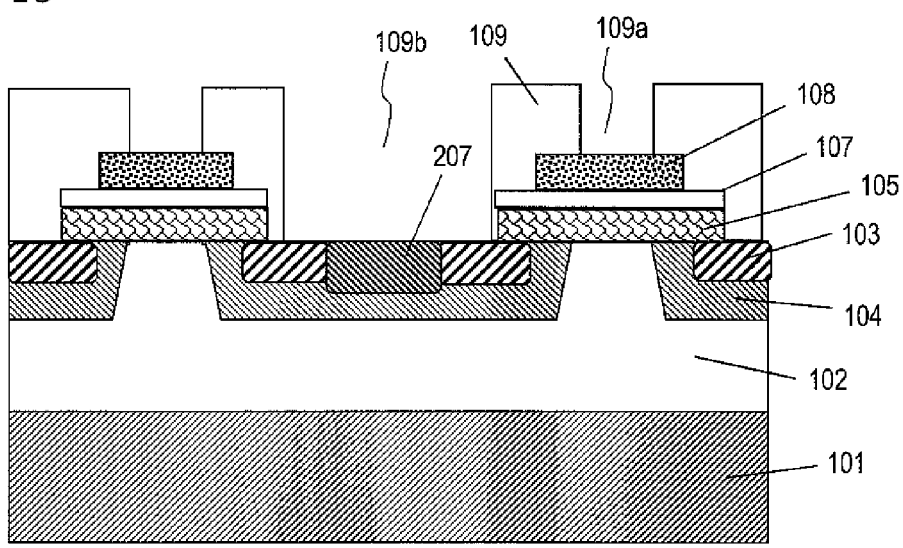
FIG. 45 is a step-by-step cross-sectional view illustrating the method for manufacturing the conventional semiconductor device shown in FIG. 37.
Figure 46:
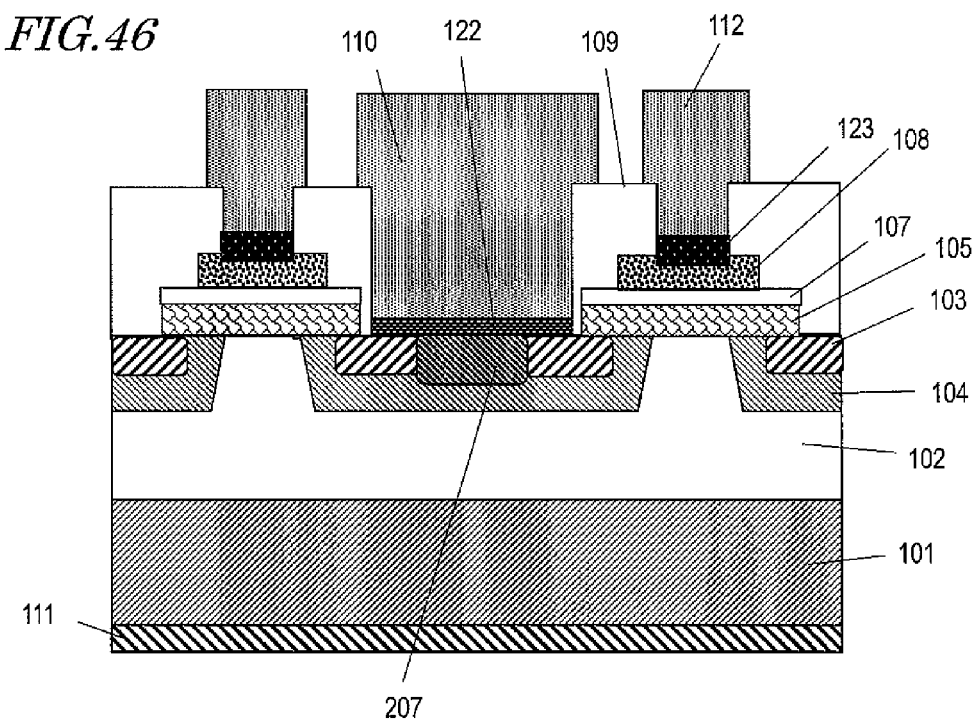
FIG. 46 is a step-by-step cross-sectional view illustrating the method for manufacturing the conventional semiconductor device shown in FIG. 37.
Figure 47:
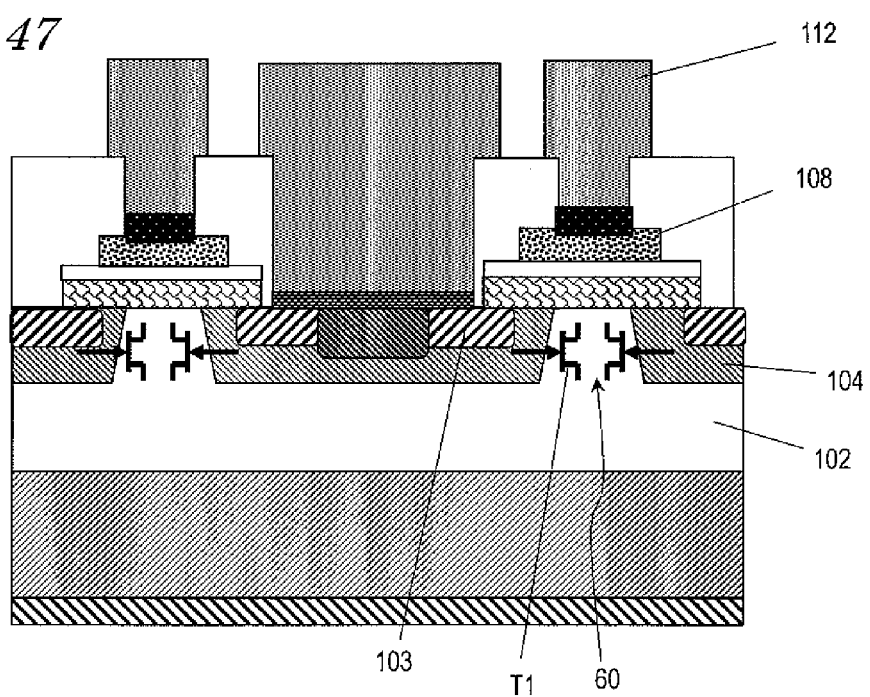
Figure 48:
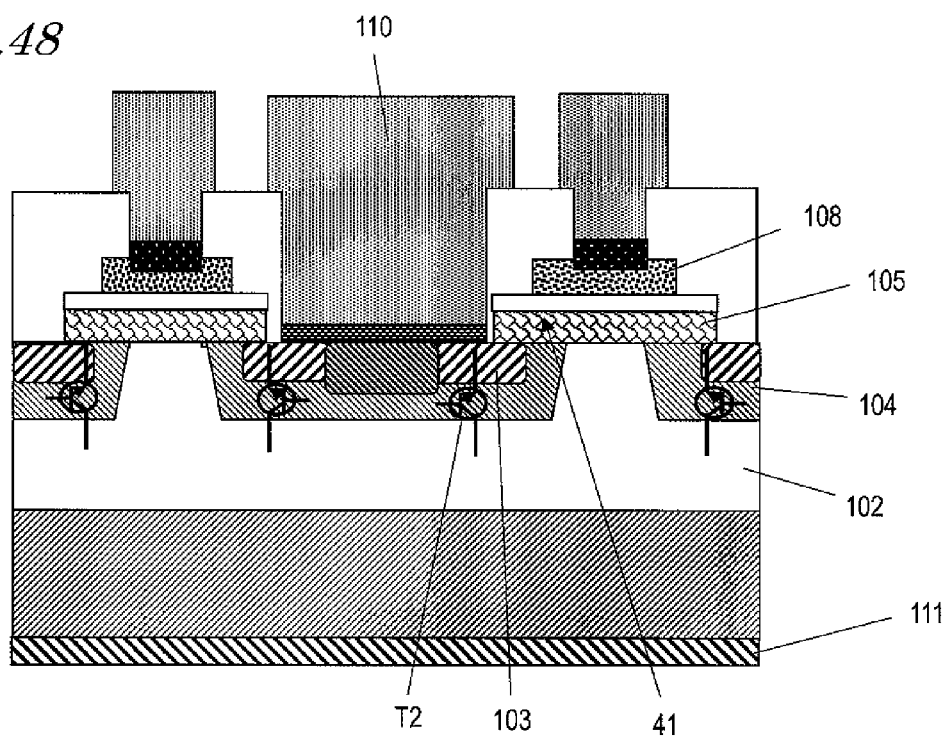
FIG. 48 is a schematic cross-sectional view illustrating an equivalent circuit produced when the conventional semiconductor device is turned OFF.

FIGS. 35 and 36 are schematic cross-sectional views illustrating other semiconductor devices of the first to third embodiments. Semiconductor devices 600 and 700 shown in FIGS. 35 and 36 are accumulation channel MISFETs having the planar structure. For the sake of simplicity, like elements to those of FIGS. 1 and 17 are denoted by the same reference numerals and will not be further described below.

The semiconductor device 600 shown in FIG. 35 has a similar contact trench structure to the semiconductor device 100 shown in FIG. 1. The semiconductor device 700 shown in FIG. 36 has a similar contact trench structure to the semiconductor device 300 shown in FIG. 17.

In the semiconductor devices 100 and 300, the second silicon carbide layer 105 to be the channel layer is arranged so as to be in contact with the upper surface of the first impurity region 103. In contrast, in the semiconductor devices 600 and 700 shown in FIGS. 35 and 36, a channel layer 705 is arranged in the first silicon carbide layer 120 so as to be in contact with the side surface of the first impurity region 103. The channel layer 705 is formed by implanting an impurity ion of the first conductivity type into the first silicon carbide layer 120, for example. Otherwise, the configurations of the semiconductor devices 600 and 700 are the same as those of the semiconductor devices 100 and 300 shown in FIGS. 1 and 17.

The semiconductor devices 400 and 600 described above have a contact trench of the same structure as the semiconductor device 100 shown in FIG. 1, and therefore have similar advantages. The semiconductor devices 500 and 700 have a contact trench of the same structure as the semiconductor device 300 shown in FIG. 17, and therefore have similar advantages.

INDUSTRIAL APPLICABILITY

The present invention is applicable to various semiconductor devices using silicon carbide, and is particularly suitable for a power semiconductor device capable of high-speed operations.

REFERENCE SIGNS LIST

60 JFET region
71 First sidewall
72 First implantation mask
73 Third implantation mask
74 Etching mask
75, 75' Second sidewall
76, 77, 79 Photoresist
78 Second implantation mask
80, 84 Impurity of second conductivity type
82 Impurity of first conductivity type
100, 200, 300, 400, 500, 600, 700, 1000 Semiconductor device
101 Semiconductor substrate
102 Drift region
103 First impurity region
104 Body region
105 Second silicon carbide layer
107 Gate insulating film (gate oxide film)
108 Gate electrode
109 Interlayer insulating film
109a, 109b Contact hole
110 Interconnect
111 Second ohmic electrode
112 Interconnect
120 First silicon carbide layer
121, 301 Contact trench
122 First ohmic electrode
123 Metal silicide layer
131, 202, 207 Contact region
132 Second impurity region
303 Gate trench
705 Channel layer
W1, W2 Width of contact region from trench contact side wall

The invention claimed is:

1. A semiconductor device comprising:
a semiconductor substrate having a principal surface and a reverse surface;
a first silicon carbide layer arranged on the principal surface of the semiconductor substrate;

a first impurity region of a first conductivity type arranged in the first silicon carbide layer;

a body region of a second conductivity type arranged adjacent to the first impurity region in the first silicon carbide layer;

a contact region of the second conductivity type which is arranged at a position deeper than the first impurity region in the body region and which contains an impurity of the second conductivity type at a higher concentration than the body region;

a drift region of the first conductivity type arranged in a region of the first silicon carbide layer other than the body region and the first impurity region; and a first ohmic electrode in ohmic contact with the first impurity region and the contact region, wherein:

a contact trench, which penetrates through the first impurity region, is provided in the first silicon carbide layer, the contact trench having a bottom surface and a side wall, and the side wall of the contact trench including a side wall lower portion present at a position deeper than a bottom surface of the first impurity region and a side wall upper portion present at a position at the same level or shallower than the bottom surface of the first impurity region;

the first ohmic electrode is arranged in the contact trench and in contact with the contact region on at least a portion of the side wall lower portion and the bottom surface of the contact trench; and the side wall lower portion of the contact trench extends from a plane parallel to an upper surface of the first silicon carbide layer toward the upper surface of the first silicon carbide layer at an inclination angle α of less than 90 degrees with respect to the plane parallel to the upper surface of the first silicon carbide layer, and the side wall upper portion of the contact trench extends from another plane parallel to the upper surface of the first silicon carbide layer toward the upper surface of the first silicon carbide layer at an inclination angle β of less than 90 degrees with respect to the another plane parallel to the upper surface of the first silicon carbide layer and the inclination angle β is greater than the inclination angle α.

2. The semiconductor device according to claim 1, wherein the contact trench has an opening larger than an area of the bottom surface.

3. The semiconductor device according to claim 1, wherein the bottom surface of the contact trench is located inside a contour of the contact region as seen from a direction vertical to the principal surface of the semiconductor substrate.

4. The semiconductor device according to claim 1, wherein the first ohmic electrode is arranged in the contact trench and on the upper surface of the first silicon carbide layer, and is in contact with the first impurity region on the upper surface of the first silicon carbide layer.

5. The semiconductor device according to claim 1, wherein the first ohmic electrode is in contact with the first impurity region on at least a portion of the side wall upper portion of the contact trench.

6. The semiconductor device according to claim 1, wherein:

the first silicon carbide layer further includes a second impurity region, which contains an impurity of the same first conductivity type at substantially the same concentration as the first impurity region, and contains an impurity of the second conductivity type at a higher concentration than the first impurity region; and the second impurity region is arranged along the side wall upper portion of the contact trench between the first ohmic electrode and the first impurity region.

7. The semiconductor device according to claim 1, wherein a portion of the contact region located around the bottom surface of the contact trench overlaps the first impurity region as seen from a direction vertical to the principal surface of the semiconductor substrate.

8. The semiconductor device according to claim 7, wherein the portion of the contact region that overlaps the first impurity region as seen from the direction vertical to the principal surface of the semiconductor substrate is thicker than a portion that is located below the bottom surface of the contact trench.

9. A method for manufacturing a semiconductor device comprising:

a step (a) of using a semiconductor substrate having a principal surface and a reverse surface to form a first silicon carbide layer on the principal surface of the semiconductor substrate, the first silicon carbide layer including a body region of a second conductivity type, a first impurity region of a first conductivity type arranged adjacent to the body region, and a drift region of the first conductivity type arranged in a region other than the body region and the first impurity region, at least a portion of the body region being present at a position deeper than the first impurity region;

a step (b) of forming a contact trench, which penetrates through the first impurity region to reach the body region, in the first silicon carbide layer;

a step (c) of implanting an impurity of the second conductivity type into the body region from a bottom surface and a side wall of the contact trench, thereby forming a contact region of the second conductivity type at a position deeper than the first impurity region; and a step (d) of forming a first ohmic electrode at least in the contact trench so as to be in contact with the first impurity region and in contact with the contact region on a portion of the side wall and the bottom surface of the contact trench, wherein in the step (b), the contact trench is formed so that a portion of the side wall of the contact trench that is deeper than a bottom surface of the first impurity region extends from a plane parallel to an upper surface of the first silicon carbide layer toward the upper surface of the first silicon carbide layer at an inclination angle α of less than 90 degrees with respect to the plane parallel to the upper surface of the first silicon carbide layer, and a portion of the side wall of the contact trench that is at the same level or shallower than the bottom surface of the first impurity region extends from another plane parallel to the upper surface of the first silicon carbide layer toward the upper surface of the first silicon carbide layer at an inclination angle β of less than 90 degrees with respect to the another plane parallel to the upper surface of the first silicon carbide layer and the inclination angle β is greater than the inclination angle α.

10. The method for manufacturing a semiconductor device according to claim 9, wherein in the step (d), the first ohmic electrode is formed in the contact trench and on an upper surface of the first silicon carbide layer so as to be in contact with the first impurity region on the upper surface of the first silicon carbide layer.

11. The method for manufacturing a semiconductor device according to claim 9, wherein the first ohmic electrode is in contact with the first impurity region on a portion of the side wall of the contact trench that is at the same level or shallower than a surface of the impurity region.

12. The method for manufacturing a semiconductor device according to claim 9, wherein in the step (c), the impurity of the second conductivity type is also implanted into the first impurity region from the side wall of the contact trench, thereby forming a second impurity region in the first impurity region.

13. The method for manufacturing a semiconductor device according to claim 9, wherein the contact trench has an opening larger than an area of the bottom surface of the contact trench.

14. The method for manufacturing a semiconductor device according to claim 9, wherein the step of forming the first ohmic electrode comprises:
- a step of depositing a metal in the contact trench and on a portion of the upper surface of the first silicon carbide layer; and
- a step of reacting the metal and the first silicon carbide layer with each other through a heat treatment, thereby forming the first ohmic electrode including a metal silicide layer.

15. The semiconductor device according to claim 1, wherein the bottom surface of the contact trench does not overlap the first impurity region as seen from a direction vertical to the principal surface of the semiconductor substrate.

16. The semiconductor device according to claim 1, wherein the bottom surface of the contact trench aligns with the bottom of the contact region as seen from a direction vertical to the principal surface of the semiconductor substrate.

* * * * *